(12) United States Patent
Otsuji

(10) Patent No.: US 11,094,524 B2
(45) Date of Patent: Aug. 17, 2021

(54) SUBSTRATE PROCESSING METHOD AND SUBSTRATE PROCESSING APPARATUS

(71) Applicant: SCREEN Holdings Co., Ltd., Kyoto (JP)

(72) Inventor: Masayuki Otsuji, Kyoto (JP)

(73) Assignee: SCREEN Holdings Co., Ltd.

( * ) Notice: Subject to any disclaimer, the term of this patent is extended or adjusted under 35 U.S.C. 154(b) by 97 days.

(21) Appl. No.: 15/699,158

(22) Filed: Sep. 8, 2017

(65) Prior Publication Data

US 2018/0076018 A1 Mar. 15, 2018

(30) Foreign Application Priority Data

Sep. 12, 2016 (JP) .............................. JP2016-177883

(51) Int. Cl.
| | |
|---|---|
| *H01L 21/02* | (2006.01) |
| *B08B 3/08* | (2006.01) |
| *H01L 21/67* | (2006.01) |
| *B08B 3/10* | (2006.01) |

(Continued)

(52) U.S. Cl.
CPC .......... *H01L 21/02052* (2013.01); *B08B 3/08* (2013.01); *B08B 3/10* (2013.01); *B08B 5/00* (2013.01); *H01L 21/02057* (2013.01); *H01L 21/67028* (2013.01); *H01L 21/67051* (2013.01); *H01L 21/67253* (2013.01); *H01L 21/68764* (2013.01)

(58) Field of Classification Search
CPC .... B08B 3/08; B08B 3/10; B08B 5/00; H01L 21/02052; H01L 21/02057; H01L 21/67028; H01L 21/67051; H01L 21/67253; H01L 21/68764
USPC ....... 134/2, 3, 19, 26, 28, 30, 31, 32, 33, 37
See application file for complete search history.

(56) References Cited

U.S. PATENT DOCUMENTS

| | | | |
|---|---|---|---|
| 5,882,433 A | 3/1999 | Ueno | 134/31 |
| 6,328,809 B1 | 12/2001 | Elsawy et al. | 134/3 |
| 7,008,853 B1 | 3/2006 | Dupont et al. | 438/397 |

(Continued)

FOREIGN PATENT DOCUMENTS

| | | |
|---|---|---|
| CN | 104952699 A | 9/2015 |
| JP | 2005-175037 A | 6/2005 |

(Continued)

*Primary Examiner* — Nadine G Norton
*Assistant Examiner* — Christopher Remavege
(74) *Attorney, Agent, or Firm* — Ostrolenk Faber LLP

(57) ABSTRACT

A substrate processing method includes a substrate holding step of horizontally holding a substrate, a liquid film forming step of supplying a processing liquid onto the upper surface of the substrate to form a liquid film of the processing liquid covering the upper surface of the substrate, a liquid film-removed region-forming step of partially eliminating the processing liquid from the liquid film of the processing liquid to form a liquid film-removed region in the liquid film of the processing liquid, a liquid film-removed region enlarging step of enlarging the liquid film-removed region toward the outer periphery of the substrate, and a hydrogen fluoride atmosphere-holding step of keeping the ambient atmosphere at the boundary between the liquid film-removed region and the liquid film of the processing liquid as an atmosphere of hydrogen fluoride-containing vapor, in parallel with the liquid film-removed region enlarging step.

12 Claims, 25 Drawing Sheets

(51) Int. Cl.
*B08B 5/00* (2006.01)
*H01L 21/687* (2006.01)

(56) References Cited

U.S. PATENT DOCUMENTS

| | | | |
|---|---|---|---|
| 7,811,412 B2* | 10/2010 | Miya | H01L 21/67017 118/730 |
| 8,440,573 B2* | 5/2013 | Mikhaylichenko | H01L 21/0206 438/719 |
| 2001/0037822 A1* | 11/2001 | Elsawy | H01L 21/67028 134/30 |
| 2002/0108641 A1 | 8/2002 | Lee et al. | 134/30 |
| 2006/0194404 A1 | 8/2006 | Dupont et al. | 438/397 |
| 2006/0231125 A1* | 10/2006 | Yi | H01L 21/67028 134/33 |
| 2007/0072092 A1 | 3/2007 | Shimoaoki et al. | 430/5 |
| 2007/0295365 A1 | 12/2007 | Miya et al. | 134/26 |
| 2008/0066783 A1 | 3/2008 | Tanaka | 134/21 |
| 2008/0078426 A1 | 4/2008 | Miya et al. | 134/30 |
| 2009/0291198 A1* | 11/2009 | Yoshihara | G03F 7/162 427/8 |
| 2010/0101497 A1* | 4/2010 | Izuta | H01L 21/67028 118/730 |
| 2012/0045581 A1* | 2/2012 | Kimura | H01L 21/02057 427/248.1 |
| 2013/0014785 A1 | 1/2013 | Kimura et al. | 134/31 |
| 2013/0255718 A1* | 10/2013 | Takahashi | H01L 21/02054 134/3 |
| 2014/0127908 A1* | 5/2014 | Okutani | H01L 21/0206 438/694 |
| 2015/0270146 A1* | 9/2015 | Yoshihara | H01L 21/68742 134/18 |
| 2015/0279708 A1 | 10/2015 | Kobayashi et al. | |
| 2016/0214148 A1 | 7/2016 | Okutani et al. | |
| 2017/0186620 A1* | 6/2017 | Marumoto | H01L 21/02082 |
| 2017/0236729 A1* | 8/2017 | Kawabuchi | H01L 21/67051 134/10 |
| 2018/0047593 A1* | 2/2018 | Mui | H01L 21/67034 |

FOREIGN PATENT DOCUMENTS

| | | |
|---|---|---|
| JP | 2006-108349 A | 4/2006 |
| JP | 2006-237620 A | 9/2006 |
| JP | 2008-128567 A | 6/2008 |
| JP | 2013-021208 A | 1/2013 |
| JP | 5412218 B2 | 2/2014 |
| JP | 2014-112652 A | 6/2014 |
| JP | 2016-162847 A | 9/2016 |
| KR | 10-2018-0000516 A | 1/2008 |
| KR | 10-2008-0026491 A | 3/2008 |
| TW | 529069 B | 4/2003 |
| TW | 556255 B | 10/2003 |
| WO | WO 00/22654 A1 | 4/2000 |

* cited by examiner

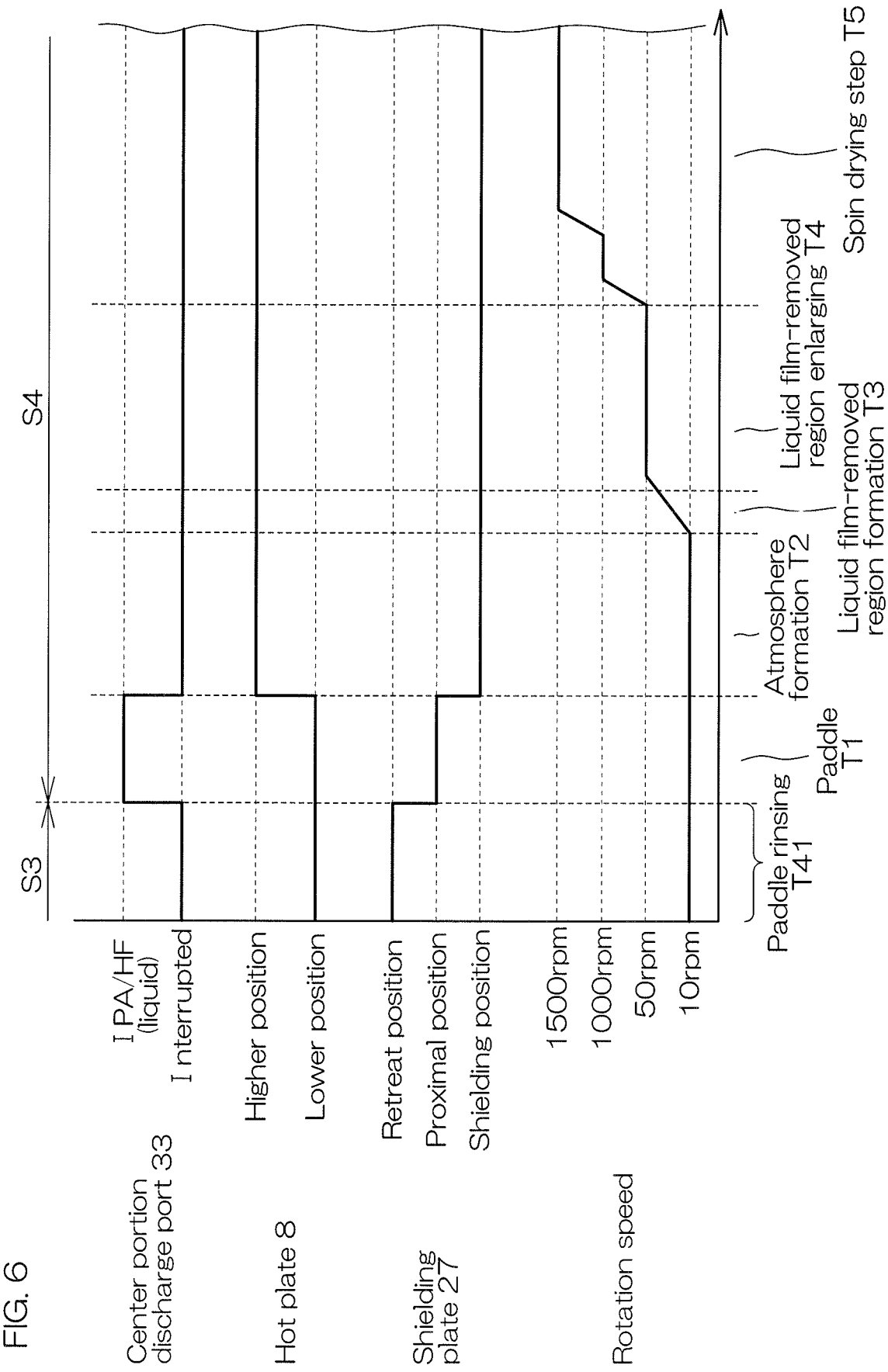

FIG. 14
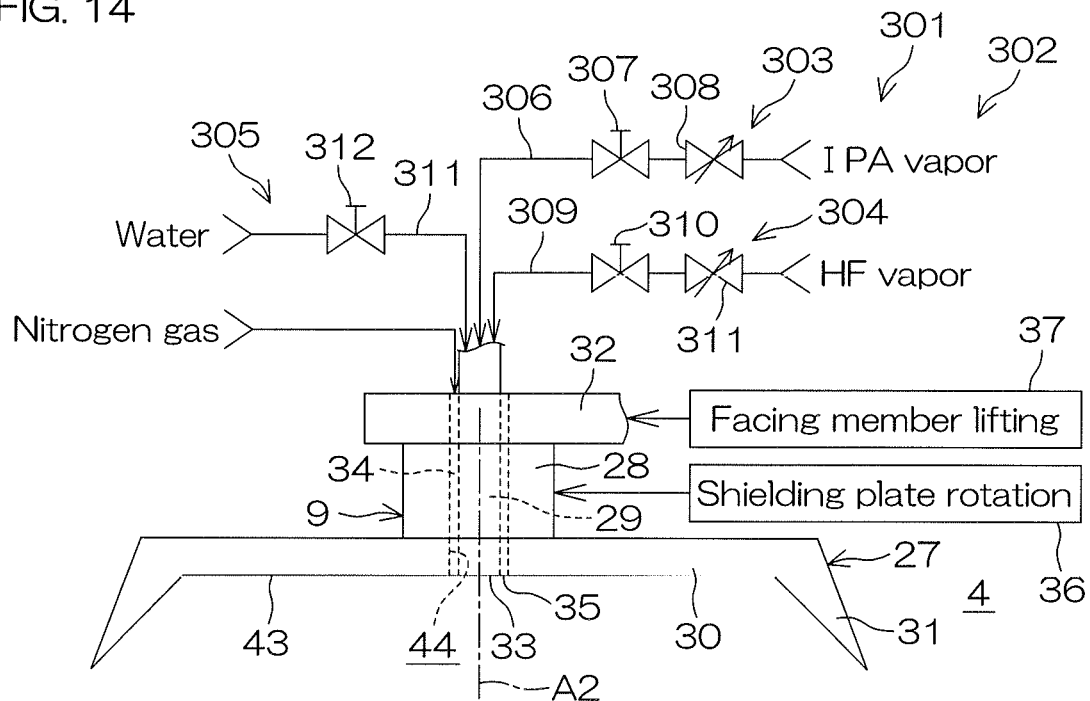
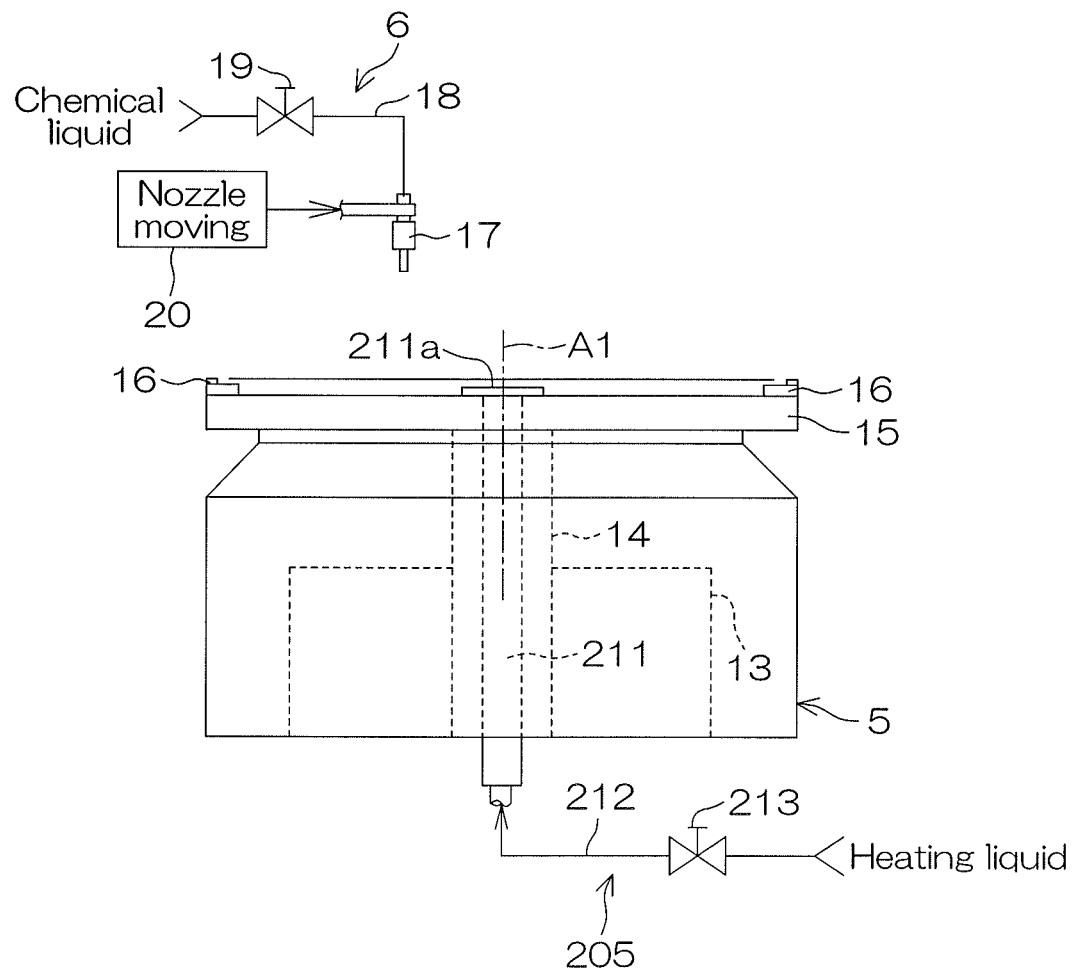

IPA

Collapse rate 10.6%

IPA/HF(100 : 1)

Collapse rate 2.5%

SUBSTRATE PROCESSING METHOD AND SUBSTRATE PROCESSING APPARATUS

BACKGROUND OF THE INVENTION

1. Field of the Invention

The present invention relates to a substrate processing method and to a substrate processing apparatus. Examples of substrates to be processed include semiconductor wafers, substrates for liquid crystal displays, substrates for plasma displays, substrates for FEDs (Field Emission Displays), substrates for optical disks, substrates for magnetic disks, substrates for magneto-optical disks, substrates for photomasks, ceramic substrates, substrates for solar cells, and the like.

2. Description of the Related Art

In the production process for a semiconductor device, the front surface of a substrate such as a semiconductor wafer is subjected to processing with a processing liquid. A single substrate processing type substrate processing apparatus in which substrates are processed one at a time includes a spin chuck that rotates the substrate while holding the substrate essentially horizontally, and a nozzle that supplies a processing liquid to the front surface of the substrate that is rotated by the spin chuck.

In a typical substrate processing step, a chemical liquid is supplied to the substrate held by the spin chuck. Water is then supplied to the substrate, whereby the chemical liquid on the substrate is replaced with the water. A spin drying step is then carried out to eliminate the water on the substrate. In the spin drying step, the substrate is rotated at high speed, and thus the water adhered to the substrate is removed (dried) by being spun off. The water used is generally deionized water.

When a fine pattern is formed on the front surface of a substrate, it may potentially be impossible in the spin drying step to remove the water that has entered the interior of the pattern, and therefore defects in drying may occur. A technique has therefore been proposed in which an organic solvent such as isopropyl alcohol (IPA) is supplied to the front surface of the substrate after processing with water, to replace the water that has entered the gaps of the pattern on the front surface of the substrate with the organic solvent, thereby drying the front surface of the substrate.

As disclosed in US Unexamined Patent Application Publication No. U.S. Pat. No. 5,882,433 A, in a spin drying step of drying a substrate by high-speed rotation of the substrate, a liquid surface (the interface between air and the liquid) is formed in the pattern. In this case, surface tension of the liquid acts at the contact position between the liquid surface and the pattern. The surface tension is one cause of collapse of the pattern.

When a liquid that is an organic solvent (hereinafter referred to simply as "organic solvent") is to be supplied to the front surface of the substrate, prior to the spin drying step that follows rinse processing, as disclosed in US Unexamined Patent Application Publication No. U.S. Pat. No. 5,882, 433 A, the organic solvent enters the pattern. The surface tension of the organic solvent is lower than that of water such as typical rinse liquid. Therefore, the problem of pattern collapse caused by surface tension is lessened.

SUMMARY OF THE INVENTION

In recent years, however, due to increased integration of devices (for example, semiconductor devices) that are fabricated utilizing substrate processing, fine patterns with high aspect ratios (convex patterns, line patterns and the like) have come to be formed on the front surfaces of substrates. Because fine patterns with high aspect ratios have low strength, they are susceptible to collapse even with the surface tension acting on the liquid surface of the organic solvent.

It is therefore an object of the present invention to provide a substrate processing method and a substrate processing apparatus that are capable of drying the upper surface of the substrate while effectively suppressing collapse of the inhibit pattern.

The present invention provides a substrate processing method that includes a substrate holding step of horizontally holding a substrate, a liquid film forming step of supplying a processing liquid onto the upper surface of the substrate to form a liquid film of the processing liquid covering the upper surface of the substrate, a liquid film-removed region-forming step of partially eliminating the processing liquid from the liquid film of the processing liquid to form a liquid film-removed region in the liquid film of the processing liquid, a liquid film-removed region enlarging step of enlarging the liquid film-removed region toward the outer periphery of the substrate, in parallel with the liquid film-removed region enlarging step, and a hydrogen fluoride atmosphere-holding step of keeping the ambient atmosphere at the boundary between the liquid film-removed region and the liquid film of the processing liquid as an atmosphere of hydrogen fluoride-containing vapor, in parallel with the liquid film-removed region enlarging step.

At the boundary between the liquid film-removed region and the liquid film of the processing liquid (hereinafter referred to simply as "liquid film boundary"), pattern collapse may potentially occur when the processing liquid is removed from between adjacent patterns. The present inventors have observed the following in regard to the mechanism of this pattern collapse. Specifically, when collapse occurs instantaneously in a pattern with elasticity, due to the elasticity of the pattern itself, some degree of force acts toward causing the collapsing pattern to stand up (recover). However, even if the pattern actually has elasticity, the collapsed pattern fails to stand up and the collapsed state of the pattern is maintained. The present inventors believe that one cause for maintenance of the collapsed state is that the tip portions of the pattern that instantaneously collapses adheres to the tip portions of adjacent patterns via intercalary products on the upper surface of the substrate, and this causes the pattern to fail to stand up and the collapsed state to be maintained. When a silicon substrate is used as the substrate, silicon oxides are intercalary on the upper surface (front surface) of the substrate, and therefore such products are believed to include mainly silicon oxides.

According to this method, the liquid film boundary is moved over the upper surface of the substrate W toward the outer periphery while keeping the ambient atmosphere at the boundary between the liquid film-removed region and the liquid film of the processing liquid as hydrogen fluoride-containing vapor (hereinafter referred to as "hydrogen fluoride vapor").

Since the liquid film boundary is kept as an atmosphere of hydrogen fluoride vapor, hydrogen fluoride reacts with the silicon oxides precipitated on the liquid film of the processing liquid, decomposing the silicon oxides to $H_2SiF_6$ and water, as represented by formula (1).

$$SiO_2 + 6HF \rightarrow H_2SiF_6 + 2H_2O \tag{1}$$

This can cause the silicon oxides precipitated in the processing liquid to fail to adhere to the pattern, or it can result in removal of the silicon oxides adhering to the pattern.

Since silicon oxides are not adhering to the tip portions of the pattern, the pattern that has instantaneously collapsed stands up by the elasticity of the pattern itself. This can effectively reduce collapse of the pattern and dry the upper surface of the substrate.

According to a preferred embodiment of the present invention, in the liquid film-removed region enlarging step, the processing liquid included in the liquid film of the processing liquid has a liquid temperature that is higher than ordinary temperature.

Reaction of hydrogen fluoride with silicon oxides may potentially form a residue (for example, $H_2SiF_6$ residue).

According to this method, in the liquid film-removed region enlarging step, the processing liquid included in the liquid film of the processing liquid has a liquid temperature that is higher than ordinary temperature. The melting point of $H_2SiF_6$ is approximately 19° C., and evaporation of the residue is accelerated as the temperature of the liquid film of the processing liquid increases above ordinary temperature. It is therefore possible to evaporate the residue and remove the residue from the upper surface of the substrate.

Furthermore, the liquid film of the processing liquid formed in the liquid film forming step may include processing liquid that is at ordinary temperature. In such cases, the method may further include, in parallel with the liquid film-removed region enlarging step, a heating step of heating the liquid film of the processing liquid.

According to this method, the liquid film of the processing liquid is heated in parallel with the liquid film-removed region enlarging step. Thus, a simple method can be used to bring the processing liquid included in the liquid film of the processing liquid to a temperature higher than ordinary temperature in the liquid film-removed region enlarging step.

The liquid film of the processing liquid formed by the liquid film forming step may also include a liquid film of a hydrofluoric acid-containing solution, that includes hydrofluoric acid. The space above the substrate may be a shielded space that is shielded from its surrounding area. In this case, the hydrogen fluoride atmosphere-holding step may include a step of evaporating the hydrofluoric acid included in the liquid film of the hydrofluoric acid-containing solution within the shielded space, to supply hydrogen fluoride-containing vapor to the shielded space.

According to this method, the hydrofluoric acid included in the liquid film of the processing liquid is evaporated in the shielded space so that hydrogen fluoride vapor is supplied to the shielded space. Thus, a method of moving the liquid film boundary toward the outer periphery of the substrate while keeping the ambient atmosphere at the liquid film boundary as hydrogen fluoride vapor, can be carried out without separately supplying gas into the shielded space.

In addition, the liquid film of the hydrofluoric acid-containing solution may include a liquid film of a liquid mixture of an organic solvent having a lower surface tension than water, and hydrofluoric acid.

According to this method, the liquid film of the hydrofluoric acid-containing solution includes a liquid film of a liquid mixture of an organic solvent having a lower surface tension than water, and hydrofluoric acid. Because the liquid film of the hydrofluoric acid-containing solution includes an organic solvent, it is possible to lower the surface tension of the liquid included in the liquid film of the hydrofluoric acid-containing solution, thereby pattern collapse can further be minimized.

In addition, the space above the substrate may be a shielded space that is shielded from its surrounding area. In this case, the hydrogen fluoride atmosphere-holding step may include a hydrogen fluoride vapor supply step of supplying hydrogen fluoride-containing vapor to the shielded space, in order to keep the surrounding area of the liquid film of the processing liquid as hydrogen fluoride vapor.

According to this method, hydrogen fluoride vapor is supplied to the shielded space that has been shielded from the surrounding area. The space can thereby be filled with hydrogen fluoride vapor. As a result, the liquid film-removed region can be enlarged toward the outer periphery of the substrate while keeping the ambient atmosphere at the liquid film boundary as a hydrogen fluoride vapor atmosphere.

In addition, the liquid film of the processing liquid may be a liquid film of an organic solvent having a lower surface tension than water.

The hydrogen fluoride-containing vapor may also include vapor including an organic solvent having a lower surface tension than water, and hydrogen fluoride.

According to this method, the hydrogen fluoride-containing vapor includes not only hydrogen fluoride but also an organic solvent, and therefore it is possible to supply vapor of the organic solvent to the region of the liquid film of the processing liquid near the boundary with the liquid film-removed region, thereby pattern collapse at the liquid film boundary can be minimized.

The liquid film of the processing liquid may also include a liquid film of water.

In addition, the hydrogen fluoride vapor supply step may include a step of blowing the hydrogen fluoride-containing vapor toward the upper surface of the substrate.

According to this method, hydrogen fluoride vapor is blown to the liquid film-removed region, thereby enlarging of the liquid film-removed region can be accelerated. Consequently, blowing hydrogen fluoride vapor toward the upper surface of the substrate not only allows hydrogen fluoride vapor to be supplied to the shielded space that has been shielded from the surrounding area, but can also accelerate enlarging of the liquid film-removed region.

The present invention further provides a substrate processing apparatus includes a substrate holding unit that holds a substrate horizontally, a rotation unit that rotates the substrate held by the substrate holding unit around a rotational axis running through its center portion, a shielded space-forming unit for forming a shielded space shielded from its surrounding area, above the substrate held by the substrate holding unit, a hydrofluoric acid-containing solution supply unit arranged to supply a hydrofluoric acid-containing solution that includes hydrofluoric acid to the upper surface of the substrate, and a controller that controls the rotation unit and the hydrofluoric acid-containing solution supply unit, wherein the controller executes a liquid film forming step of supplying the hydrofluoric acid-containing solution to the upper surface of the substrate to form a liquid film of a hydrofluoric acid-containing solution covering the upper surface of the substrate, a liquid film-removed region-forming step of partially eliminating the hydrofluoric acid-containing solution from the liquid film of the hydrofluoric acid-containing solution to form a liquid film-removed region in the liquid film of the hydrofluoric acid-containing solution, a liquid film-removed region enlarging step of enlarging the liquid film-removed region toward the outer periphery of the substrate, a hydrogen fluoride atmosphere-holding step of keeping the ambient atmosphere at the boundary between the liquid film-removed region and the liquid film of the hydrofluoric acid-containing solution as an atmosphere of hydrogen fluoride-containing vapor, in parallel with the liquid film-removed region enlarging step, and in the hydrogen fluoride atmosphere-holding step, the controller executes the liquid film-removed region enlarging step in parallel with the hydrogen fluoride atmosphere-holding step, and the controller executes a step of evaporating, in the shielded space the hydrofluoric acid, that is included in the liquid film of the hydrofluoric acid-containing solution, and supplying the hydrogen fluoride-containing vapor to the shielded space.

At the liquid film boundary, pattern collapse may potentially occur when the processing liquid is removed from between adjacent patterns. The present inventors have observed the following in regard to the mechanism of this pattern collapse. Specifically, when collapse occurs instantaneously in a pattern with elasticity, due to the elasticity of the pattern itself, some degree of force acts toward causing the collapsing pattern to stand up (recover). However, even if the pattern actually has elasticity, the collapsed pattern fails to stand up and the collapsed state of the pattern is maintained. The present inventors believe that one cause for maintenance of the collapsed state is that the tip portions of the pattern that instantaneously collapses adheres to the tip portions of adjacent patterns via intercalary products on the upper surface of the substrate, and this causes the pattern to fail to standup and the collapsed state to be maintained. When a silicon substrate is used as the substrate, silicon oxides are intercalary on the upper surface (front surface) of the substrate, and therefore such products are believed to include mainly silicon oxides.

According to this configuration, the liquid film boundary is moved over the upper surface of the substrate W toward the outer periphery while keeping the ambient atmosphere at the liquid film boundary as hydrogen fluoride vapor.

Since the liquid film boundary is maintained as an atmosphere of hydrogen fluoride vapor, hydrogen fluoride reacts with the silicon oxides precipitated on the liquid film of the processing liquid, decomposing the silicon oxides to $H_2SiF_6$ and water, as represented by formula (2).

$$SiO_2 + 6HF \rightarrow H_2SiF_6 + 2H_2O \qquad (2)$$

This can cause the silicon oxides precipitated in the processing liquid to fail to adhere to the pattern, or it can result in removal of the silicon oxides adhering to the pattern.

Since silicon oxides are not adhering to the tip portions of the pattern, the pattern that has instantaneously collapsed stands up by the elasticity of the pattern itself. This can effectively reduce collapse of the pattern and dry the upper surface of the substrate.

In addition, the hydrofluoric acid included in the liquid film of the processing liquid is evaporated in the shielded space so that hydrogen fluoride vapor is supplied to the shielded space. Thus, a method of moving the liquid film boundary toward the outer periphery of the substrate while keeping the ambient atmosphere at the liquid film boundary as hydrogen fluoride vapor, can be carried out without separately supplying gas into the shielded space.

According to a preferred embodiment of the present invention, in the liquid film-removed region enlarging step, the processing liquid included in the liquid film of the processing liquid has a liquid temperature that is higher than ordinary temperature.

Reaction of hydrogen fluoride with silicon oxides may potentially form a residue (for example, $H_2SiF_6$ residue).

According to this configuration, in the liquid film-removed region enlarging step, the processing liquid included in the liquid film of the processing liquid has a liquid temperature that is higher than ordinary temperature. The melting point of $H_2SiF_6$ is approximately 19° C., and evaporation of the residue is accelerated as the temperature of the liquid film of the processing liquid increases above ordinary temperature. It is therefore possible to evaporate the residue and remove the residue from the upper surface of the substrate.

The liquid film of the processing liquid formed in the liquid film forming step may include processing liquid that is at ordinary temperature. In this case, the controller may further execute, in parallel with the liquid film-removed region enlarging step, a heating step of heating the liquid film of the processing liquid.

According to this configuration, the liquid film of the processing liquid is heated in parallel with the liquid film-removed region enlarging step. Thus, a simple method can be used to bring the processing liquid included in the liquid film of the processing liquid to a temperature higher than ordinary temperature in the liquid film-removed region enlarging step.

In addition, the liquid film of the hydrofluoric acid-containing solution may include a liquid film of a liquid mixture of an organic solvent having a lower surface tension than water, and hydrofluoric acid.

According to this configuration, the liquid film of the hydrofluoric acid-containing solution includes a liquid film of a liquid mixture of an organic solvent having a lower surface tension than water, and hydrofluoric acid. Because the liquid film of the hydrofluoric acid-containing solution includes an organic solvent, it is possible to lower the surface tension of the liquid included in the liquid film of the hydrofluoric acid-containing solution, thereby pattern collapse can further be minimized.

The liquid film of the processing liquid may also include a liquid film of water.

Also, the shielded space-forming unit may include a facing member disposed facing the upper surface of the substrate that is held by the substrate holding unit, forming between the facing member and the upper surface of the substrate, a shielded space shielded from its surrounding area.

According to this configuration, a shielded space shielded from its surrounding area can be easily formed together with the upper surface of the substrate.

The present invention further provides a substrate processing apparatus includes a substrate holding unit that holds a substrate horizontally, a rotation unit that rotates the substrate held by the substrate holding unit around a rotational axis running through its center portion, a processing liquid supply unit arranged to supply a processing liquid to the upper surface of the substrate, a shielded space-forming unit for forming a shielded space shielded from its surrounding area, above the substrate held by the substrate holding unit, a hydrogen fluoride vapor supply unit that supplies hydrogen fluoride-containing vapor to the shielded space, and a controller that controls the rotation unit, the processing liquid supply unit, and the hydrogen fluoride vapor supply unit, wherein the controller executes a substrate holding step of holding the substrate horizontally, a liquid film forming step of supplying the processing liquid to the upper surface of the substrate to form a liquid film of the processing liquid covering the upper surface of the substrate, a liquid film-removed region-forming step of partially eliminating the processing liquid from the liquid film of the processing liquid to form a liquid film-removed region in the liquid film of the processing liquid, a liquid film-removed region enlarging step of enlarging the liquid film-removed region toward the outer periphery of the substrate, and a hydrogen fluoride atmosphere-holding step of keeping the ambient atmosphere at the boundary between the liquid film-removed region and the liquid film of the processing liquid as an atmosphere of hydrogen fluoride-containing vapor, in parallel with the liquid film-removed region enlarging step, and in the hydrogen fluoride atmosphere-holding step, the controller executes the liquid film-removed region enlarging step in parallel with the hydrogen fluoride atmosphere-holding step, and the controller executes a hydrogen fluoride vapor supply step of supplying the hydrogen fluoride-containing vapor to the shielded space to keep the surrounding area of the liquid film of the processing liquid as hydrogen fluoride vapor.

At the liquid film boundary, pattern collapse may potentially occur when the processing liquid is removed from between adjacent patterns. The present inventors have observed the following in regard to the mechanism of this pattern collapse. Specifically, when collapse occurs instantaneously in a pattern with elasticity, due to the elasticity of the pattern itself, some degree of force acts toward causing the collapsing pattern to stand up (recover). However, even if the pattern actually has elasticity, the collapsed pattern fails to stand up and the collapsed state of the pattern is maintained. The present inventors believe that one cause for maintenance of the collapsed state is that the tip portions of the pattern that instantaneously collapses adheres to the tip portions of adjacent patterns via intercalary products on the upper surface of the substrate, and this causes the pattern to fail to standup and the collapsed state to be maintained. When a silicon substrate is used as the substrate, silicon oxides are intercalary on the upper surface (front surface) of the substrate, and therefore such products are believed to include mainly silicon oxides.

According to this configuration, the liquid film boundary is moved over the upper surface of the substrate W toward the outer periphery while keeping the ambient atmosphere at the liquid film boundary as hydrogen fluoride vapor.

Since the liquid film boundary is maintained as an atmosphere of hydrogen fluoride vapor, hydrogen fluoride reacts with the silicon oxides precipitated on the liquid film of the processing liquid, decomposing the silicon oxides to $H_2SiF_6$ and water, as represented by formula (3).

$$SiO_2 + 6HF \rightarrow H_2SiF_6 + 2H_2O \qquad (3)$$

This can cause the silicon oxides precipitated in the processing liquid to fail to adhere to the pattern, or it can result in removal of the silicon oxides adhering to the pattern.

Since silicon oxides are not adhering to the tip portions of the pattern, the pattern that has instantaneously collapsed stands up by the elasticity of the pattern itself. This can effectively reduce collapse of the pattern and dry the upper surface of the substrate.

Furthermore, hydrogen fluoride vapor is supplied to the shielded space that has been shielded from the surrounding area. The space can thereby be filled with hydrogen fluoride vapor. As a result, the liquid film-removed region is enlarged toward the outer periphery of the substrate while keeping the ambient atmosphere at the liquid film boundary as a hydrogen fluoride vapor atmosphere.

According to the preferred embodiment of the present invention, in the liquid film-removed region enlarging step, the processing liquid included in the liquid film of the processing liquid has a liquid temperature that is higher than ordinary temperature.

Reaction of hydrogen fluoride with silicon oxides may potentially form a residue (for example, $H_2SiF_6$ residue).

According to this configuration, in the liquid film-removed region enlarging step, the processing liquid included in the liquid film of the processing liquid has a liquid temperature that is higher than ordinary temperature. The melting point of $H_2SiF_6$ is approximately 19° C., and evaporation of the residue is accelerated as the temperature of the liquid film of the processing liquid increases above ordinary temperature. It is therefore possible to evaporate the residue and remove the residue from the upper surface of the substrate.

The liquid film of the processing liquid formed in the liquid film forming step may include processing liquid that is at ordinary temperature. In this case, the controller may further execute, in parallel with the liquid film-removed region enlarging step, a heating step of heating the liquid film of the processing liquid.

According to this configuration, the liquid film of the processing liquid is heated in parallel with the liquid film-removed region enlarging step. Thus, a simple method can be used to bring the processing liquid included in the liquid film of the processing liquid to a temperature higher than ordinary temperature in the liquid film-removed region enlarging step.

The liquid film of the processing liquid may also include a liquid film of water.

Moreover, the controller may also include, in the hydrogen fluoride vapor supply step, a step of blowing the hydrogen fluoride-containing vapor toward the upper surface of the substrate.

According to this method, hydrogen fluoride vapor is blown to the liquid film-removed region, thereby enlarging of the liquid film-removed region can be accelerated. Consequently, blowing hydrogen fluoride vapor toward the upper surface of the substrate not only allows hydrogen fluoride vapor to be supplied to the shielded space that has been shielded from the surrounding area, but can also accelerate enlarging of the liquid film-removed region.

Also, the shielded space-forming unit may include a facing member disposed facing the upper surface of the substrate that is held by the substrate holding unit, forming between the facing member and the upper surface of the substrate, a shielded space shielded from its surrounding area.

According to this configuration, a shielded space shielded from its surrounding area can be easily formed together with the upper surface of the substrate.

The aforementioned as well as yet other objects, features, and effects of the present invention will be made clear by the following description of the preferred embodiments, with reference to the accompanying drawings.

BRIEF DESCRIPTION OF THE DRAWINGS

FIG. 6 is a timing chart for describing a rinsing step and a drying step included in the first substrate processing example.

FIG. 14 is an illustrative cross-sectional view for describing a configuration example of a processing unit included in a substrate processing apparatus according to a third preferred embodiment of the present invention.

DETAILED DESCRIPTION OF PREFERRED EMBODIMENTS

Figure 1:
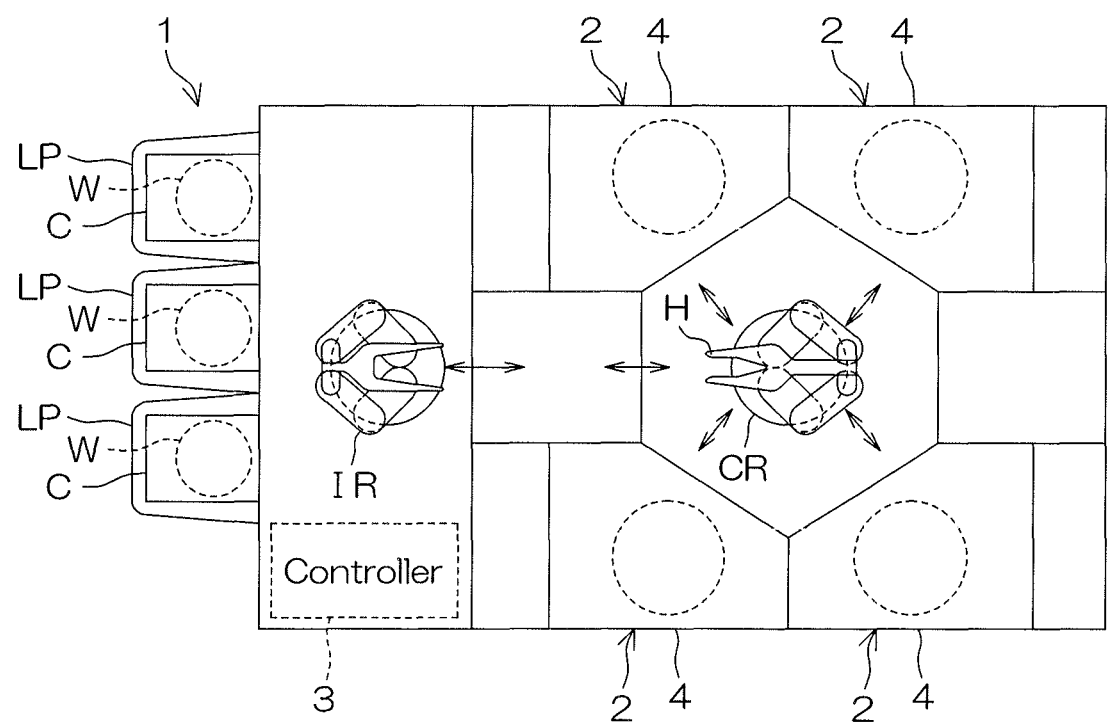
FIG. 1 is a plan view for describing a layout of the interior of a substrate processing apparatus according to a first preferred embodiment of the present invention.

FIG. 1 is an illustrative plan view for describing a layout of the interior of a substrate processing apparatus 1 according to a first preferred embodiment of the present invention. The substrate processing apparatus 1 is a single substrate processing type apparatus that processes substrates W such as silicon wafers, one at a time. In this preferred embodiment, each substrate W is a disk-shaped substrate. The substrate processing apparatus 1 includes a plurality of processing units 2 that are to process substrates W with a processing liquid, load ports LP mounting carriers C that house a plurality of substrates W to be processed by the processing units 2, transfer robots IR and CR that transport the substrates W between the load ports LP and the processing units 2, and a controller 3 that controls the substrate processing apparatus 1. The transfer robot IR conveys the substrates W between the carriers C and the substrate transfer robot CR. The transfer robot CR conveys the substrates W between the transfer robot IR and the processing units 2. The plurality of processing units 2 may have the same configuration, for example.

Figure 2:
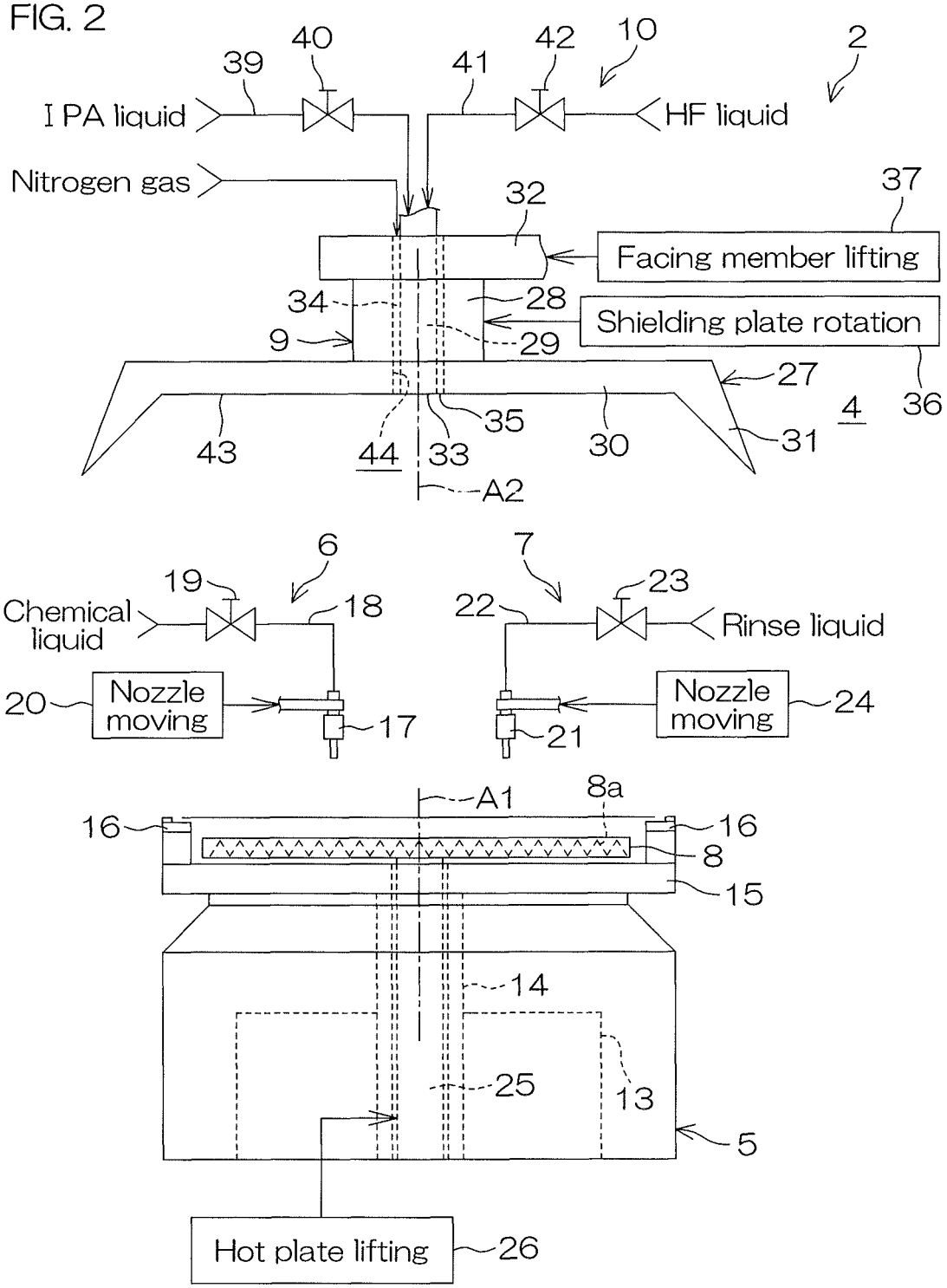
FIG. 2 is an illustrative cross-sectional view for describing a configuration example of a processing unit included in the substrate processing apparatus.

FIG. 2 is an illustrative cross-sectional view for describing a configuration example of a processing unit 2.

The processing unit 2 includes a box-shaped chamber 4, a spin chuck (substrate holding unit, rotation unit) 5 that holds a single substrate W in a horizontal posture in the chamber 4, and rotates the substrate W around a vertical rotational axis A1 running through the center of the substrate W, a chemical liquid supply unit (processing liquid supply unit) 6 that supplies a chemical liquid onto the upper surface of the substrate W held by the spin chuck 5, a rinse liquid supply unit (processing liquid supply unit) 7 arranged to supply a rinse liquid (processing liquid) onto the upper surface of the substrate W held by the spin chuck 5, a hot plate (heating unit) 8 that heats the substrate W held by the spin chuck 5, from the lower surface side, a facing member 9 that faces the upper surface of the substrate W held by the spin chuck 5, an organic solvent/hydrofluoric acid mixture supply unit (hydrofluoric acid-containing solution supply unit) 10 that supplies a liquid mixture of IPA (isopropyl alcohol), as an example of an organic solvent having a lower surface tension than water, and hydrofluoric acid (hydrogen fluoride (HF) solution) (processing liquid: hereinafter referred to as "organic solvent/hydrofluoric acid mixture," or IPA/HF (solution) in FIG. 6) onto the substrate W held by the spin chuck 5, and a tubular cup (not shown) enclosing the surrounding area of the spin chuck 5.

The chamber 4 has box-shaped partition walls (not shown) that house the spin chuck 5 and nozzle. In the partition walls, clean air (air that has been filtered by a filter) is supplied by an FFU (Fan Filter Unit, not shown). Also, the gas in the chamber 4 is discharged through an exhaust air duct (not shown). The processing of the substrate W is carried out in the chamber 4 in a state with a downflow (downward flow) formed flowing downward in the chamber 4.

As the spin chuck 5, a clamping type chuck that clamps the substrate W in the horizontal direction to hold the substrate W horizontally is adopted. Specifically, the spin chuck 5 includes a spin motor 13, a spin shaft 14 integrated with the drive shaft of the spin motor 13, and a disk-shaped spin base 15 mounted essentially horizontally on the upper end of the spin shaft 14.

On the upper surface of the spin base 15, there are disposed a plurality (3 or more, such as 6) clamping members 16, at the peripheral edge portion. The plurality of clamping members 16 are disposed at appropriate intervals on the upper surface peripheral edge portion of the spin base 15, on the circumference corresponding to the outer perimeter shape of the substrate W.

The spin chuck 5 is not limited to a clamping type and, for example, a vacuum suction type arrangement (vacuum chuck) that vacuum-suctions a rear surface of the substrate W to hold the substrate W in a horizontal orientation and further performs rotation around the vertical rotation axis in this state to rotate the substrate W held by the spin chuck 5 may be adopted instead.

The chemical liquid supply unit 6 includes a chemical liquid nozzle 17, a chemical liquid line 18 connected to the chemical liquid nozzle 17, a chemical liquid valve 19 provided in the chemical liquid line 18, and a first nozzle moving unit 20 that moves the chemical liquid nozzle 17. The chemical liquid nozzle 17 is a straight nozzle that discharges liquid as a continuous flow, for example. A chemical liquid is supplied from a chemical liquid supply source to the chemical liquid line 18.

When the chemical liquid valve 19 is opened, the chemical liquid that has been supplied from the chemical liquid line 18 to the chemical liquid nozzle 17 is discharged downward from the chemical liquid nozzle 17. When the chemical liquid valve 19 is closed, discharge of the chemical liquid from the chemical liquid nozzle 17 is interrupted. The first nozzle moving unit 20 moves the chemical liquid nozzle 17 between a processing position where the chemical liquid discharged from the chemical liquid nozzle 17 is supplied to the upper surface of the substrate W, and a retreat position where the chemical liquid nozzle 17 has retreated beside the spin chuck 5, in a plan view.

Specific examples of chemical liquids are an etching solution and a cleaning chemical liquid. More specifically, the chemical liquid may be a liquid including at least one from among sulfuric acid, acetic acid, nitric acid, hydrochloric acid, hydrofluoric acid, ammonia water, hydrogen peroxide water, organic acids (for example, citric acid, oxalic acid, etc.), organic alkalis (for example, TMAH: tetramethylammonium hydroxide, etc.), surfactants and corrosion inhibitors.

The rinse liquid supply unit 7 includes a rinse liquid nozzle 21, a rinse liquid line 22 connected to the rinse liquid nozzle 21, a rinse liquid valve 23 provided in the rinse liquid line 22, and a second nozzle moving unit 24 that moves the rinse liquid nozzle 21. The rinse liquid nozzle 21 is a straight nozzle that discharges liquid as a continuous flow, for example. A rinse liquid at ordinary temperature (approximately 23° C.) is supplied from a rinse liquid supply source to the rinse liquid line 22.

When the rinse liquid valve 23 is opened, the rinse liquid supplied from the rinse liquid line 22 to the rinse liquid nozzle 21 is discharged downward from the rinse liquid nozzle 21. When the rinse liquid valve 23 is closed, discharge of the rinse liquid from the rinse liquid nozzle 21 is interrupted. The second nozzle moving unit 24 moves the rinse liquid nozzle 21 between a processing position where the chemical liquid discharged from the rinse liquid nozzle 21 is supplied to the upper surface of the substrate W, and a retreat position where the rinse liquid nozzle 21 has retreated beside the spin chuck 5, in a plan view.

A specific example for the rinse liquid is deionized water (DIW), for example, but is not limited to DIW and may instead be carbonated water, electrolytic ion water, hydrogen water, ozone water or hydrochloric acid water at diluted concentration (for example, approximately 10 ppm to 100 ppm).

The chemical liquid nozzle 17 and rinse liquid nozzle 21 do not need to be provided in a scannable manner, and for example, they may be provided in a fixed manner above the spin chuck 5, as a "fixed-nozzle" form in which the processing liquid (chemical liquid or rinse liquid) lands at a prescribed position on the upper surface of the substrate W.

The hot plate 8 has a disk-shaped shape with approximately the same diameter as the substrate W or a slightly smaller diameter than the substrate W, and it is in a horizontal posture. The hot plate 8 is disposed between the upper surface of the spin base 15 and the lower surface of the substrate W that is held by the spin chuck 5. The hot plate 8 is composed of, for example, a heater 8a embedded inside a ceramic plate main body. Heat release from the heater 8a causes the upper surface of the hot plate 8 to be heated. The hot plate 8 is supported from below by a vertical support rod 25. The support rod 25 is inserted in the spin base 15 and the spin shaft 14. The support rod 25 is not in contact with the spin base 15 and spin shaft 14. The support rod 25 is provided in a non-rotatable and raisable/lowerable manner with respect to the chamber 4. That is, the hot plate 8 does not rotate even when the spin chuck 5 has rotated. Consequently, when the spin chuck 5 rotates the substrate W, the substrate W and hot plate 8 undergo relative rotation around the rotational axis A1.

Coupled with the support rod 25 is a hot plate lifting unit 26 for raising and lowering of the hot plate 8 while in the horizontal posture. By driving of the hot plate lifting unit 26, the hot plate 8 is raisable/lowerable between a higher position where its upper surface is proximal to though separated by a prescribed minute interval from the upper surface of the spin base 15, and a lower position that is lower than the higher position and where almost all of the radiant heat from the hot plate 8 fails to reach the lower surface of the substrate W. Raising and lowering of the hot plate 8 changes the interval between the hot plate 8 and the substrate W.

The facing member 9 includes a shielding plate 27, an upper spin shaft 28 provided in an integrally rotatable manner with the shielding plate 27, and an upper nozzle 29 running through the center portion of the shielding plate 27 in the vertical direction. The shielding plate 27 includes a disk portion 30 disposed horizontally, and a tubular portion 31 provided along the outer perimeter edge of the disk portion 30. The disk portion 30 has a disk-shaped shape with a diameter that is approximately the same as or not less than the substrate W. The disk portion 30 has, on its lower surface, a circular substrate-facing surface 43 facing the entire region of the upper surface of the substrate W. At the center portion of the substrate-facing surface 43, there is formed a cylindrical through-hole 44 running vertically through the disk portion 30. The through-hole 44 is partitioned by a cylindrical inner peripheral surface.

The tubular portion 31 may also be truncated conical. As shown in FIG. 2, the tubular portion 31 may extend downward while widening outward from the outer perimeter edge of the disk portion 30. Also as shown in FIG. 2, the tubular portion 31 may have decreasing wall thickness as it approaches the lower end of the tubular portion 31.

The upper spin shaft 28 is provided in a rotatable manner around a rotational axis A2 extending vertically through the center of the shielding plate 27 (axis matching the rotational axis A1 of the substrate W). The upper spin shaft 28 is cylindrical. The inner peripheral surface of the upper spin shaft 28 is formed as a cylindrical surface centered around the rotational axis A2. The interior space of the upper spin shaft 28 communicates with the through-hole 44 of the shielding plate 27. The upper spin shaft 28 is supported in a relatively rotatable manner by a support arm 32 extending horizontally above the shielding plate 27.

In this preferred embodiment, the upper nozzle 29 functions as a central axis nozzle. The upper nozzle 29 is disposed above the spin chuck 5. The upper nozzle 29 is supported by the support arm 32. The upper nozzle 29 is non-rotatable with respect to the support arm 32. The upper nozzle 29 is raised and lowered together with the shielding plate 27, the upper spin shaft 28, and the support arm 32. The upper nozzle 29 forms, at its lower end portion, a center portion discharge port 33 that faces the center portion of the upper surface of the substrate W that is held by the spin chuck 5. The center portion discharge port 33 is disposed either at approximately the same height as the substrate-facing surface 43 of the shielding plate 27, or higher than the substrate-facing surface 43. Between the upper nozzle 29 and the shielding plate 27 and upper spin shaft 28, there is formed a cylindrical tubular gap 34, the tubular gap 34 functioning as a flow passage through which an inert gas such as nitrogen gas circulates. The lower end of the tubular gap 34 opens as a ring enclosing the upper nozzle 29, forming a peripheral discharge port 35.

A shielding plate rotation unit 36 with a configuration that includes an electric motor and the like, is coupled with the shielding plate 27. The shielding plate rotation unit 36 rotates the shielding plate 27 and the upper spin shaft 28 around the rotational axis A2, with respect to the support arm 32.

Also, a facing member lifting unit 37 having a configuration including an electric motor, ball screw, etc., is coupled with the support arm 32. The facing member lifting unit 37 raises and lowers the facing member 9 (the shielding plate 27 and upper spin shaft 28) and the upper nozzle 29, in the vertical direction together with the support arm 32.

The facing member lifting unit 37 raises and lowers the shielding plate 27 between a shielding position (see FIG. 7B, etc.) where the substrate-facing surface 43 is proximal to the upper surface of the substrate W that is held by the spin chuck 5 and the height of the lower end of the tubular portion 31 is positioned lower than the height of the substrate W, and a retreat position where it has retreated significantly higher than the shielding position (see FIG. 2). The facing member lifting unit 37 can hold the shielding plate 27 at three positions, for example (the shielding position, the proximal position and the retreat position). The shielding position is a position such that the substrate-facing surface 43 forms a shielded space 38 with the upper surface of the substrate W (see FIG. 7B, etc.). The shielded space 38 is not completely isolated from its surrounding space, but inflow of gas from the surrounding space into the shielded space 38 does not occur. That is, the shielded space 38 is essentially shielded from its surrounding space. According to this preferred embodiment, the facing member 9 and the facing member lifting unit 37 form a shielded space-forming unit for formation of the shielded space 38.

The organic solvent/hydrofluoric acid mixture supply unit 10 supplies an organic solvent/hydrofluoric acid mixture to the upper nozzle 29. The organic solvent/hydrofluoric acid mixture supply unit 10 includes an organic solvent liquid line 39 connected to the upper nozzle 29, an organic solvent liquid valve 40 provided in the organic solvent liquid line 39, a hydrofluoric acid line 41 connected to the upper nozzle 29, and a hydrofluoric acid valve 42 provided in the hydrofluoric acid line 41. By simultaneously opening the organic solvent liquid valve 40 and the hydrofluoric acid valve 42, the organic solvent liquid at ordinary temperature, for example, and hydrofluoric acid are supplied to the upper nozzle 29, whereby the organic solvent/hydrofluoric acid mixture is discharged downward from the center portion discharge port 33.

Figure 3:
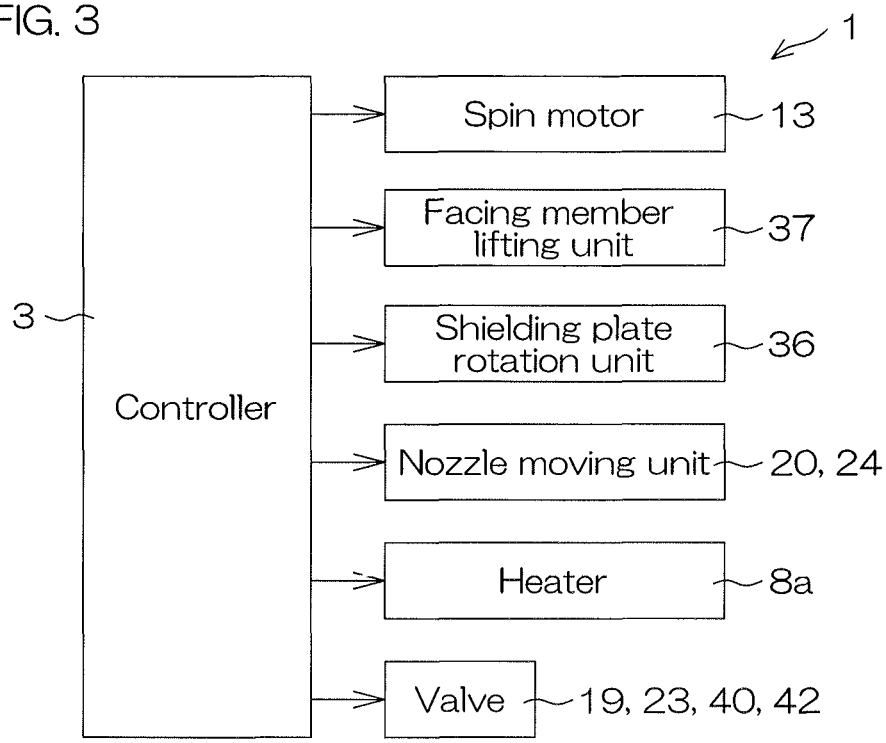
FIG. 3 is a block diagram for describing an electrical configuration of the main portion of the substrate processing apparatus.

FIG. 3 is a block diagram for describing the electrical configuration of the main portion of a substrate processing apparatus 1.

The controller 3 is configured using, for example, a microcomputer. The controller 3 has a computing unit such as a CPU, a memory unit such as a fixed memory device or hard disk drive, and an input/output unit. A program executed by the computing unit is stored in the memory unit.

Also, the controller 3 controls operations of the spin motor 13, the facing member lifting unit 37, the shielding plate rotation unit 36, the first nozzle moving unit 20, the second nozzle moving unit 24, the heater 8a, etc., according to a predetermined program. The controller 3 also opens and closes the chemical liquid valve 19, the rinse liquid valve 23, the organic solvent liquid valve 40, the hydrofluoric acid valve 42, etc., according to a predetermined program.

Figure 4:
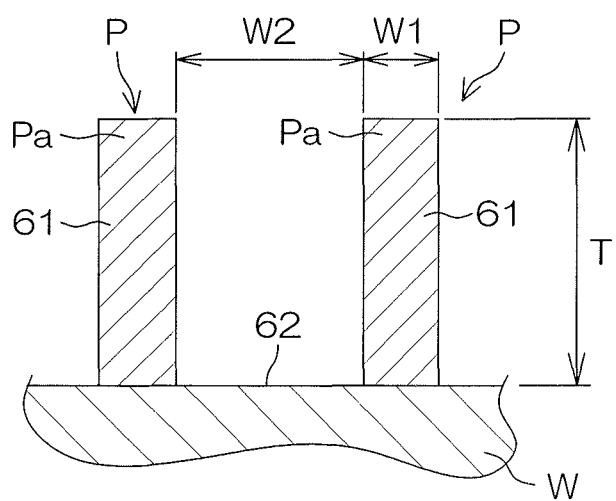
FIG. 4 is a cross-sectional view showing an enlarged view of the front surface of a substrate to be processed by the processing unit.

FIG. 4 is a cross-sectional view showing an enlarged view of the front surface of a substrate W to be processed by the processing unit 2. The substrate W to be processed is a silicon wafer, for example, and a pattern P is formed on the front surface (an upper surface 62) which is the pattern-formed surface. The pattern P is a fine pattern, for example. As shown in FIG. 4, the pattern P may have a structure 61 with convex shapes (columns) arranged in a matrix form. In this case, the arrangement is such that the line width W1 of the structure 61 is about 10 nm to 45 nm, for example, and the gap W2 of the pattern P is about 10 nm to several μm, for example. The film thickness T of the pattern P is about 1 μm, for example. Also, the pattern P may have an aspect ratio (ratio of the film thickness T with respect to the line width W1) of about 5 to 500, for example (typically about 5 to 50).

The pattern P may also be one with a line pattern formed by fine trenches aligned in a repeating fashion. The pattern P may also be formed by providing a plurality of micropores (voids or pores) in the thin-film.

The pattern P includes an insulating film, for example. The pattern P may also include a conductor film. More specifically, the pattern P may be formed by a laminated film obtained by laminating a plurality of films, and may further include an insulating film and a conductor film. The pattern P may also be a pattern composed of a single-layer film. The insulating film may be a silicon oxide film ($SiO_2$ film) or silicon nitride film (SiN film). The conductor film may be an amorphous silicon film introducing impurities for lower resistance, or a metal film (for example, a metal wiring film).

The pattern P may also be a hydrophilic film. An example of a hydrophilic film is a TEOS film (a type of silicon oxide film).

Figure 5:
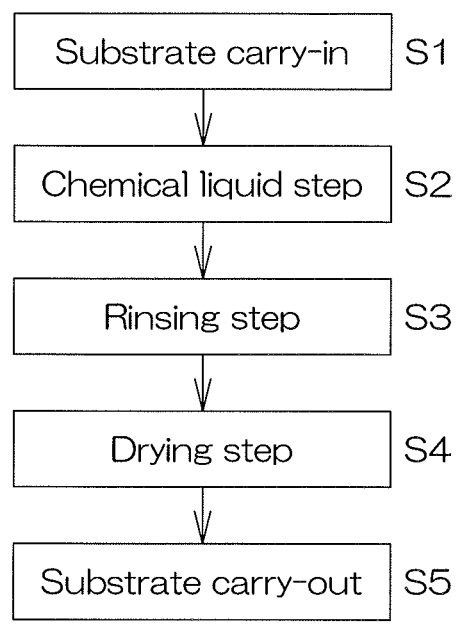
FIG. 5 is a flow chart illustrating a first substrate processing example by the substrate processing apparatus.
Figure 7A:
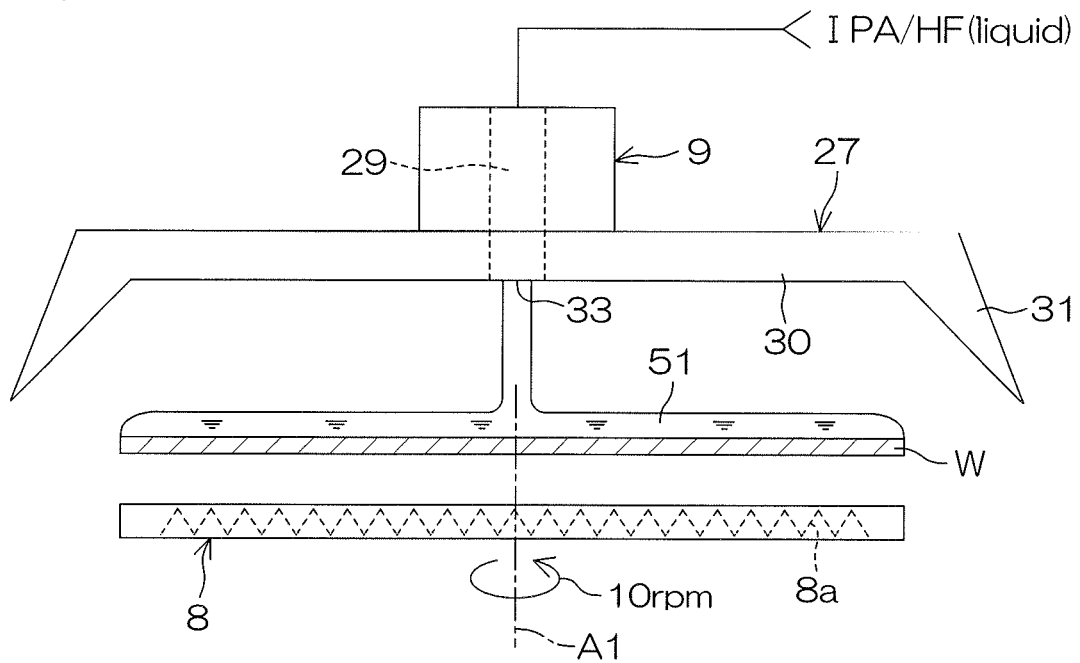
FIG. 7A is an illustrative cross-sectional view for describing a paddle step (T1 of FIG. 6).
Figure 7B:
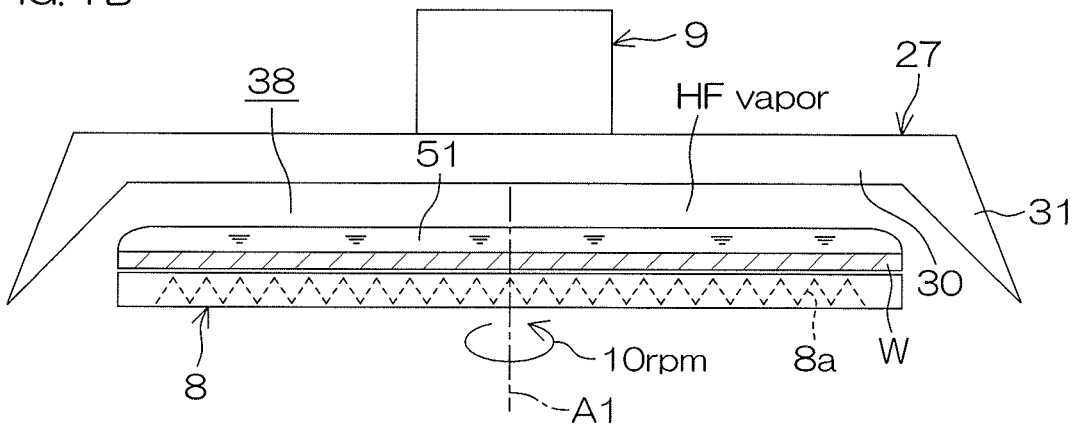
FIG. 7B is an illustrative cross-sectional view for describing an atmosphere-forming step (T2 of FIG. 6).
Figure 7C:
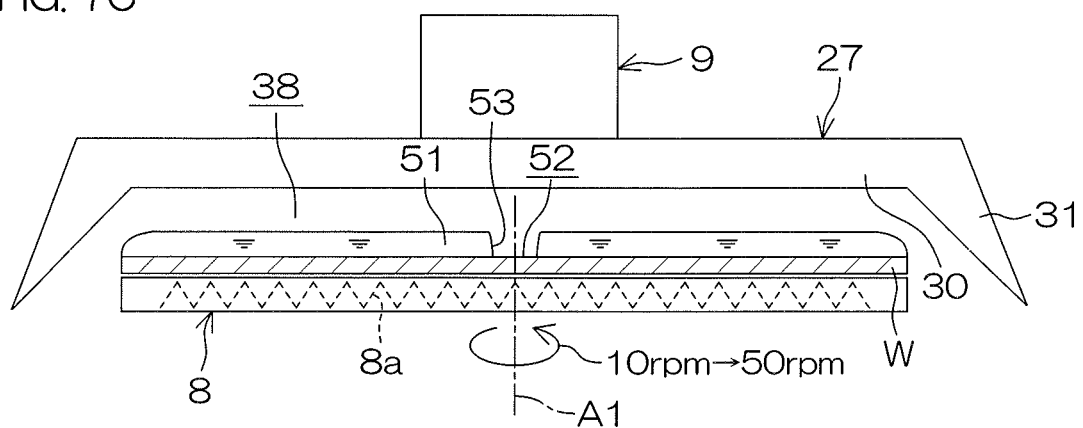
FIG. 7C is an illustrative cross-sectional view for describing a liquid film-removed region-forming step (T3 of FIG. 6).
Figure 7D:
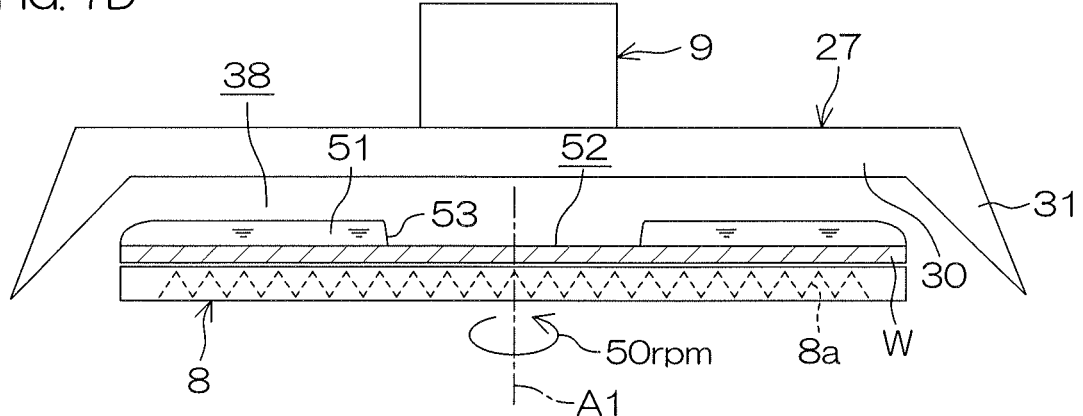
FIG. 7D is an illustrative cross-sectional view for describing a liquid film-removed region enlarging step (T4 of FIG. 6).
Figure 7E:
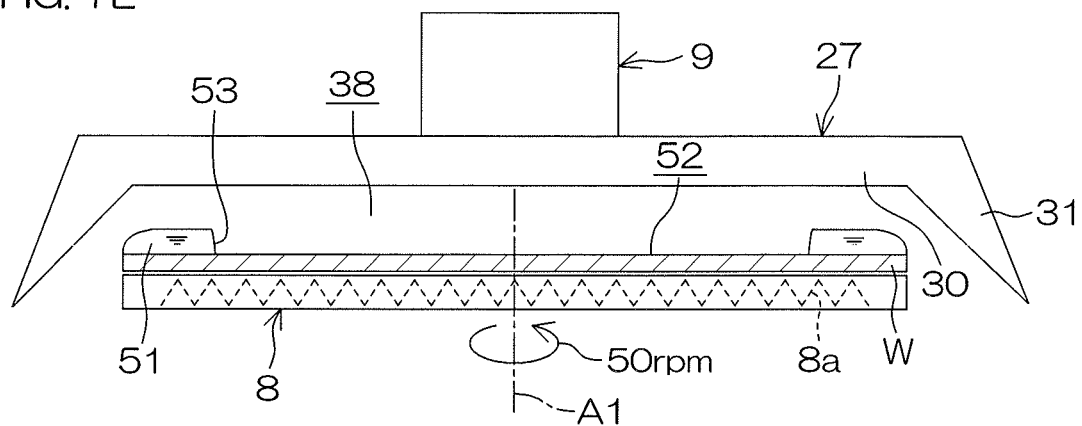
FIG. 7E is a diagram showing the state continuing to FIG. 7D, in the liquid film-removed region enlarging step.

FIG. 5 is a flow chart illustrating a first substrate processing example by the substrate processing apparatus 1. FIG. 6 is a timing chart for describing a rinsing step (S3 of FIG. 5) and a drying step (S4 of FIG. 5) included in the first substrate processing example. FIGS. 7A to 7F are illustrative cross-sectional views for describing a drying step (S4 of FIG. 5). FIG. 8 is a cross-sectional view showing an enlarged view of the state of the front surface of the substrate W in the liquid film-removed region enlarging step T14.

The first substrate processing example will now be explained with reference to FIG. 1 to FIG. 6. FIG. 7A to 7F and FIG. 8 will also be referred to as appropriate.

The unprocessed substrate W (for example, a circular substrate with a diameter of 450 mm) is carried into the processing unit 2 from the carrier C by the transfer robots IR, CR, carried into the chamber 4, and delivered to the spin chuck 5 with the front surface (pattern-formed surface) of the substrate W facing upward, whereby the substrate W is held by the spin chuck 5 (S1 of FIG. 5: substrate carry-in (substrate holding step)). Before carry-in of the substrate W, the chemical liquid nozzle 17 and rinse liquid nozzle 21 are caused to retreat to a home position set beside the spin chuck 5. The shielding plate 27 is also caused to retreat to the retreat position.

After the transfer robot CR has retreated out of the processing unit 2, the controller 3 executes the chemical liquid step (step S2 of FIG. 5). Specifically, the controller 3 controls the spin motor 13 to rotate the spin base 15 at the prescribed liquid processing speed (for example, approximately 800 rpm). The controller 3 also controls the first nozzle moving unit 20 to move the chemical liquid nozzle 17 from the retreat position to the processing position. Next, the controller 3 opens the chemical liquid valve 19, and discharges the chemical liquid from the chemical liquid nozzle 17 toward the upper surface of the substrate W that is in a rotational state. The chemical liquid that has been discharged from the chemical liquid nozzle 17 is supplied to the upper surface of the substrate W and then flows outward along the upper surface of the substrate W by centrifugal force. Also, the controller 3 moves the chemical liquid supply position with respect to the upper surface of the substrate W between the center portion and the peripheral edge portion, while the substrate W is rotating. As a result, the chemical liquid supply position passes across the entire region of the upper surface of the substrate W, the entire region of the upper surface of the substrate W is scanned, and the entire region of the upper surface of the substrate W is uniformly processed. When a predetermined period of time has elapsed from the start of discharge of the chemical liquid, the controller 3 closes the chemical liquid valve 19, interrupting discharge of the chemical liquid from the chemical liquid nozzle 17, and then controls the first nozzle moving unit 20 to cause the chemical liquid nozzle 17 to retreat from above the spin chuck 5.

Next, the controller 3 executes the rinsing step (step S3 of FIG. 5). The rinsing step is a step of replacing the chemical liquid on the substrate W with a rinse liquid to eliminate the chemical liquid from the top of the substrate W. Specifically, the controller 3 controls the second nozzle moving unit 24 to move the rinse liquid nozzle 21 from the retreat position to the processing position. Next, the controller 3 opens the rinse liquid valve 23, and discharges the rinse liquid from the rinse liquid nozzle 21 toward the upper surface of the substrate W that is in a rotational state. The rinse liquid that has been discharged from the rinse liquid nozzle 21 is supplied to the upper surface of the substrate W and then flows outward along the upper surface of the substrate W by centrifugal force. Also, the controller 3 moves the rinse liquid supply position with respect to the upper surface of the substrate W between the center portion and the peripheral edge portion, while the substrate W is rotating. As a result, the rinse liquid supply position passes across the entire region of the upper surface of the substrate W, and the entire region of the upper surface of the substrate W is scanned, and the entire region of the upper surface of the substrate W is uniformly processed. When a predetermined period of time has elapsed from the start of discharge of the rinse liquid, the controller 3 closes the rinse liquid valve 23, interrupting discharge of the rinse liquid from the rinse liquid nozzle 21, and then controls the second nozzle moving unit 24 to cause the rinse liquid nozzle 21 to retreat from above the spin chuck 5.

When a predetermined period of time has elapsed from the start of supply of the rinse liquid, and while the entire region of the upper surface of the substrate W is covered with the rinse liquid, the controller 3 controls the spin motor 13 to decelerate the rotational speed of the substrate W in a stepwise manner from the liquid processing speed to the paddle speed (the low rotational speed of zero or approximately 40 rpm or lower, or approximately 10 rpm, for example, in the first substrate processing example). Next, the rotational speed of the substrate W is kept at the paddle speed (paddle rinsing step T41 (liquid film forming step)). Thus, a liquid film of the rinse liquid covering the entire region of the upper surface of the substrate W is supported in the form of a paddle on the upper surface of the substrate W. In this state, the centrifugal force acting on the liquid film of the rinse liquid on the upper surface of the substrate W is lower than the surface tension acting between the rinse liquid and the upper surface of the substrate W, or the centrifugal force and the surface tension are essentially antagonistic. Deceleration of the substrate W weakens the centrifugal force acting on the rinse liquid on the substrate W, and reduces the amount of the rinse liquid discharged from the top of the substrate W.

When a predetermined period of time from deceleration of the substrate W to the paddle speed has elapsed, the controller 3 closes the rinse liquid valve 23 to interrupt discharge of the rinse liquid from the rinse liquid nozzle 21. Next, the controller 3 controls the second nozzle moving unit 24 to return the rinse liquid nozzle 21 to the retreat position.

When a predetermined period of time from deceleration of the substrate W to the paddle speed has elapsed, the paddle rinsing step T41 is terminated (the rinsing step (S3 of FIG. 5) is terminated), and carrying out of the drying step (step S4) is initiated. The drying step (step S4) includes a paddle step T1 of holding the liquid film 51 of an organic solvent/hydrofluoric acid mixture (liquid film of the hydrofluoric acid-containing solution) on the upper surface of the substrate W (see FIG. 6), an atmosphere-forming step T2 of filling (forming) an atmosphere containing a large amount of hydrogen fluoride vapor (HF vapor) in the shielded space 38 (see FIG. 6), a liquid film-removed region-forming step T3 of partially eliminating the organic solvent/hydrofluoric acid mixture from the liquid film 51 of the organic solvent/hydrofluoric acid mixture, to form a circular liquid film-removed region 52 at the center portion of the liquid film 51 of the organic solvent/hydrofluoric acid mixture (see FIG. 6), a liquid film-removed region enlarging step T4 of enlarging the liquid film-removed region 52 toward the outer periphery of the substrate W (see FIG. 6), and a spin drying step T5 of rotating the substrate W at a spin-off drying speed to dry the upper surface of the substrate W (see FIG. 6). Upon completion of the drying step (S4 of FIG. 5), the transfer robot CR enters the processing unit 2 and carries the processed substrate W out of the processing unit 2 (step S5 of FIG. 5). The substrate W is delivered from the transfer robot CR to the transfer robot IR, and is housed in the carrier C by the transfer robot IR.

The drying step (S4 of FIG. 5) will now be explained in detail.

Before starting the paddle step T1, the controller 3 controls the facing member lifting unit 37 to lower the shielding plate 27 from the retreat position to the proximal position. After the shielding plate 27 has been disposed at the proximal position, the controller 3 opens the organic solvent liquid valve 40 and the hydrofluoric acid valve 42, while maintaining rotation of the substrate W at the paddle speed, and discharges the organic solvent/hydrofluoric acid mixture from the center portion discharge port 33 of the shielding plate 27. As a result, the rinse liquid included in the liquid film on the upper surface of the substrate W is successively replaced with the organic solvent/hydrofluoric acid mixture. Thus, as shown in FIG. 7A, the liquid film 51 of the organic solvent/hydrofluoric acid mixture covering the entire region of the upper surface of the substrate W is held in a paddle form on the upper surface of the substrate W (paddle step T1). The thickness of a bulk portion 54 of the liquid film 51 of the organic solvent/hydrofluoric acid mixture (see FIG. 8) is greater than the height of the pattern P. When essentially all of the liquid film in the entire region of the upper surface of the substrate W has been replaced with the liquid film 51 of the organic solvent/hydrofluoric acid mixture, the controller 3 closes the organic solvent liquid valve 40 and the hydrofluoric acid valve 42 to interrupt discharge of the organic solvent/hydrofluoric acid mixture from the center portion discharge port 33. The paddle step T1 is thus completed.

When a silicon substrate is used as the substrate W, silicon oxides may potentially precipitate on the liquid film 51 of the organic solvent/hydrofluoric acid mixture. Such silicon oxides are formed in the chemical liquid step (S2 of FIG. 5) for the substrate W, and remain on the substrate W up to the drying step (S4 of FIG. 5).

After discharge of the organic solvent/hydrofluoric acid mixture has been interrupted, the controller 3 controls the facing member lifting unit 37 to lower the shielding plate 27 from the proximal position to the shielding position. Thus, a shielded space 38 (see FIG. 7B) is formed between the substrate-facing surface 43 and the upper surface of the substrate W.

Also, after discharge of the organic solvent/hydrofluoric acid mixture has been interrupted, the controller 3 controls the heater 8a to cause heat release from the hot plate 8. As a result, the substrate W is heated from the lower surface side, and the liquid film 51 of the organic solvent/hydrofluoric acid mixture on the substrate W increases in temperature. As a result of the heating, the liquid film 51 of the organic solvent/hydrofluoric acid mixture on the substrate W is heated to approximately 70 to 80° C. (a prescribed temperature higher than the melting point of $H_2SiF_6$ (approximately 19° C.) and lower than the boiling point of IPA (approximately 82.4° C.)). By increasing the temperature of the organic solvent liquid included in the liquid film 51 of the organic solvent/hydrofluoric acid mixture, the replacement performance from the rinse liquid to the organic solvent can be increased.

Also, the controller 3 rotates the substrate W at the paddle speed while interrupting supply of the processing liquid and the processing gas to the substrate W (while also interrupting discharge of inert gas from the peripheral discharge port 35). Temperature increase of the liquid film 51 of the organic solvent/hydrofluoric acid mixture causes the hydrofluoric acid included in the liquid film 51 of the organic solvent/hydrofluoric acid mixture to evaporate. The vapor of hydrogen fluoride generated by evaporation (hereinafter referred to as "hydrogen fluoride vapor") is supplied to the shielded space 38. Since hydrofluoric acid has a boiling point of approximately 19° C. it boils even at ordinary temperature (for example, approximately 23° C.), but increasing the temperature of the liquid film 51 of the organic solvent/hydrofluoric acid mixture to approximately 70 to 80° C. can further accelerate evaporation of the hydrofluoric acid. Thus, as shown in FIG. 7B, the atmosphere in the shielded space is filled with hydrogen fluoride vapor (HF vapor) (atmosphere-forming step T2).

When a predetermined period of time from completion of the paddle step T1 has elapsed, the controller 3 controls the spin motor 13 to accelerate the rotational speed of the substrate W. Specifically, the controller 3 gradually increases the rotational speed of the substrate W toward the first rotational speed (for example, approximately 50 rpm). As the rotational speed of the substrate W increases, the centrifugal force due to rotation of the substrate W becomes greater and therefore the organic solvent/hydrofluoric acid mixture at the center portion of the substrate W is pushed away outward. Thus, as shown in FIG. 7C, the liquid film 51 of the organic solvent/hydrofluoric acid mixture is partially removed at the center portion of the substrate W. As a result, a small circular liquid film-removed region 52 is formed at the center portion of the substrate W (liquid film-removed region-forming step T3). Formation of the liquid film-removed region 52 occurs with the shielded space 38 in a state filled with hydrogen fluoride vapor (HF vapor). That is, the ambient atmosphere of the liquid film 51 of the organic solvent/hydrofluoric acid mixture at the boundary 53 with the liquid film-removed region 52 (hereinafter referred to as "liquid film boundary 53") is kept as a hydrogen fluoride vapor (HF vapor) atmosphere.

After formation of the liquid film-removed region 52, the controller 3 controls the spin motor 13 to keep the rotational speed of the substrate W at the first rotational speed (for example, approximately 50 rpm). The liquid film-removed region 52 gradually enlarges as a result (liquid film-removed region enlarging step T4). As the liquid film-removed region 52 enlarges, as shown in FIG. 7D, the liquid film boundary 53 is moved toward the radially outer side. As shown in FIG. 7E, in the liquid film-removed region enlarging step T4, the liquid film-removed region 52 enlarges to the entire region of the upper surface of the substrate W. That is, the liquid film boundary 53 also is moved up to the peripheral edge of the upper surface of the substrate W. Enlargement of the liquid film-removed region 52 also occurs with the shielded space 38 in a state filled with hydrogen fluoride vapor (HF vapor) (hydrogen fluoride atmosphere-holding step). That is, the liquid film boundary 53 is moved from the center portion of the substrate W to the peripheral edge of the upper surface of the substrate W, while keeping the ambient atmosphere at the liquid film boundary 53 as hydrogen fluoride vapor (HF vapor).

As shown in FIG. 8, as the liquid film boundary 53 moves, the organic solvent/hydrofluoric acid mixture (essentially an organic solvent liquid due to evaporation of the hydrofluoric acid) is successively removed from between sections of the pattern P on the front surface of the substrate W, from the center portion of the substrate W toward the peripheral edge of the upper surface of the substrate W. A difference is produced in the surface tension acting on the pattern P through which the liquid film boundary 53 passes, whereby the pattern P instantaneously collapses toward the bulk portion 54 side (that is, outward from the substrate W). The organic solvent liquid (IPA solution) has lower surface tension than water, but because the pattern P is a fine pattern, instantaneous pattern collapse occurs.

Figure 9:
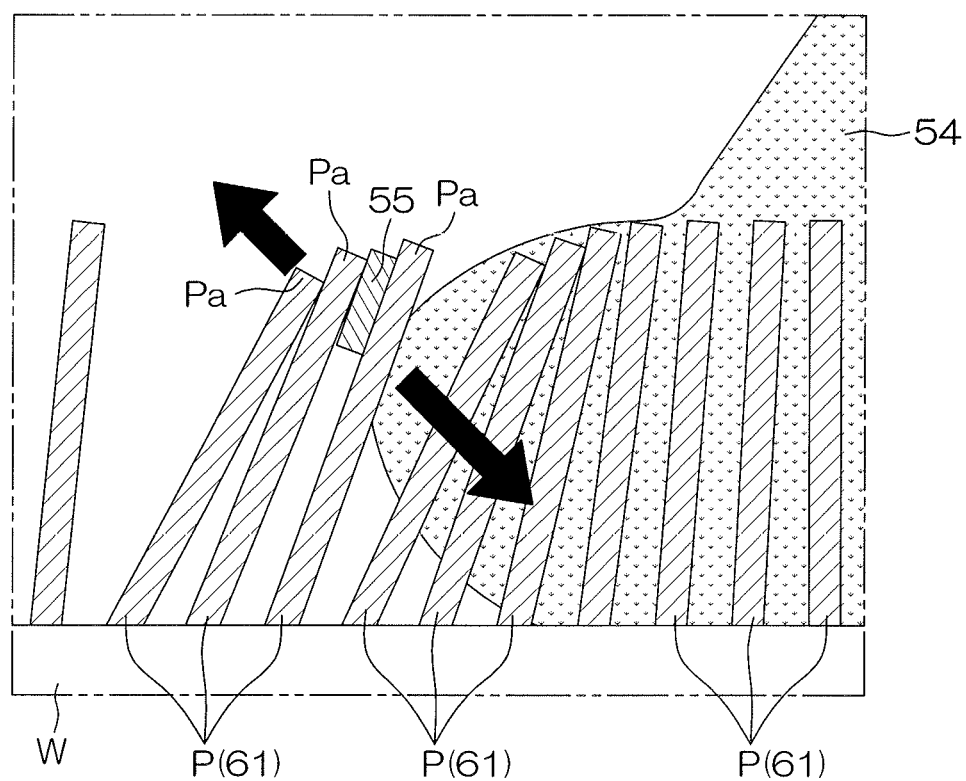
FIG. 9 is a cross-sectional view showing an enlarged view of the state of the front surface of the substrate in a reference embodiment.

FIG. 9 is a cross-sectional view showing an enlarged view of the state of the front surface of a substrate W in a reference embodiment. This reference embodiment differs from the first substrate processing example in that, in the liquid film-removed region enlarging step, no shielded space 38 is formed and the ambient atmosphere of the upper surface of the substrate W is dry air.

In the case shown in FIG. 9, presumably the collapsed state of the pattern P that has instantaneously collapsed is maintained. Specifically, when collapse has occurred instantaneously in a pattern P with elasticity, due to the elasticity of the pattern itself, some degree of force acts toward causing the collapsing pattern P to stand up (recover). However, the tip portions Pa of the pattern P that instantaneously collapses adheres to the tip portions of patterns adjacent to that pattern P on the bulk portion 54 side (that is, outward from the substrate W), via silicon oxides (that is, products 55) that have precipitated on the liquid film 51 of the organic solvent/hydrofluoric acid mixture. This prevents the pattern P from standing up (recovering), and maintains the collapsed state of the pattern P. This is thought to be the mechanism by which pattern collapse occurs over the entire region of the substrate W.

On the other hand, as shown in FIG. 8, in the first substrate processing example, the liquid film boundary 53 is moved from the center portion of the upper surface of the substrate W to the peripheral edge of the upper surface of the substrate W, while keeping the ambient atmosphere at the liquid film boundary 53 as hydrogen fluoride vapor (HF vapor). When the ambient atmosphere at the liquid film boundary 53 is kept as hydrogen fluoride vapor (HF vapor), it reacts with the silicon oxides precipitated on the liquid film 51 of the organic solvent/hydrofluoric acid mixture, decomposing the silicon oxides to $H_2SiF_6$ and water, as represented by formula (2).

$$SiO_2 + 6HF \rightarrow H_2SiF_6 + 2H_2O \qquad (2)$$

Consequently, the hydrogen fluoride contained in the ambient atmosphere at the liquid film boundary 53 reacts with the silicon oxides precipitated on the liquid film 51 of the organic solvent/hydrofluoric acid mixture. As a result, the silicon oxides precipitated on the liquid film 51 of the organic solvent/hydrofluoric acid mixture either do not adhere to the tip portion Pa of the pattern P, or the silicon oxides that have adhered to the tip portion Pa of the pattern P (that is, the product 55 (see FIG. 9)) are likewise removed from the tip portion Pa of the pattern P.

Furthermore, in the liquid film-removed region enlarging step T4, the liquid film 51 of the organic solvent/hydrofluoric acid mixture is kept at approximately 70 to 80° C. Consequently, reaction of the hydrogen fluoride contained in the hydrogen fluoride vapor (HF vapor) with silicon oxides forms $H_2SiF_6$ residue. However, the silicon oxides come in liquid contact with the organic solvent/hydrofluoric acid mixture (essentially the organic solvent liquid due to evaporation of hydrofluoric acid) which is present in the liquid film 51 of the organic solvent/hydrofluoric acid mixture and has a liquid temperature of approximately 70 to 80° C., thus promoting evaporation of such residue. Since the melting point of $H_2SiF_6$ is approximately 19° C., evaporation of the residue is accelerated in an environment of approximately 70 to 80° C. It is thereby possible to evaporate the residue and remove the residue from the front surface of the substrate W.

In addition, since the liquid temperature of the liquid film 51 of the organic solvent/hydrofluoric acid mixture is higher than the melting point of $H_2SiF_6$ (approximately 19° C.) and lower than the boiling point of IPA (approximately 82.4° C.), it is possible to remove the $H_2SiF_6$ residue while maintaining the liquid film 51 of the organic solvent/hydrofluoric acid mixture in the film state.

Figure 7F:
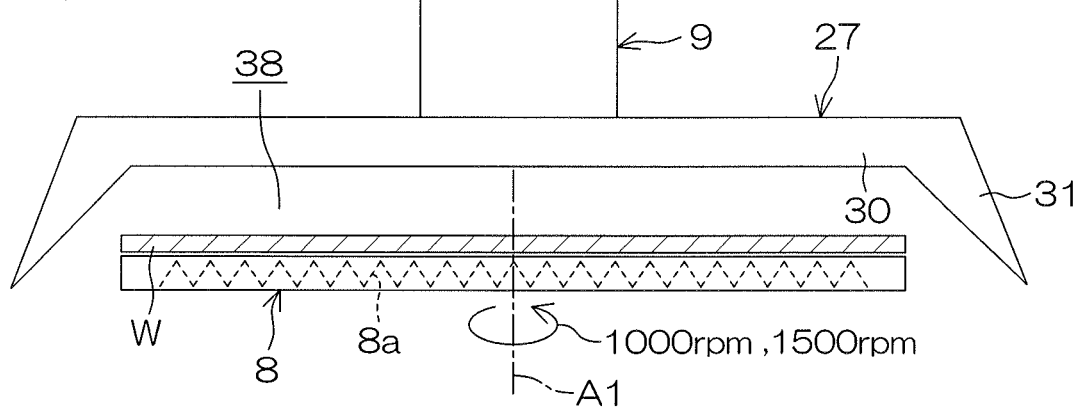
FIG. 7F is an illustrative cross-sectional view for describing a spin drying step (T5 of FIG. 6).
Figure 8:
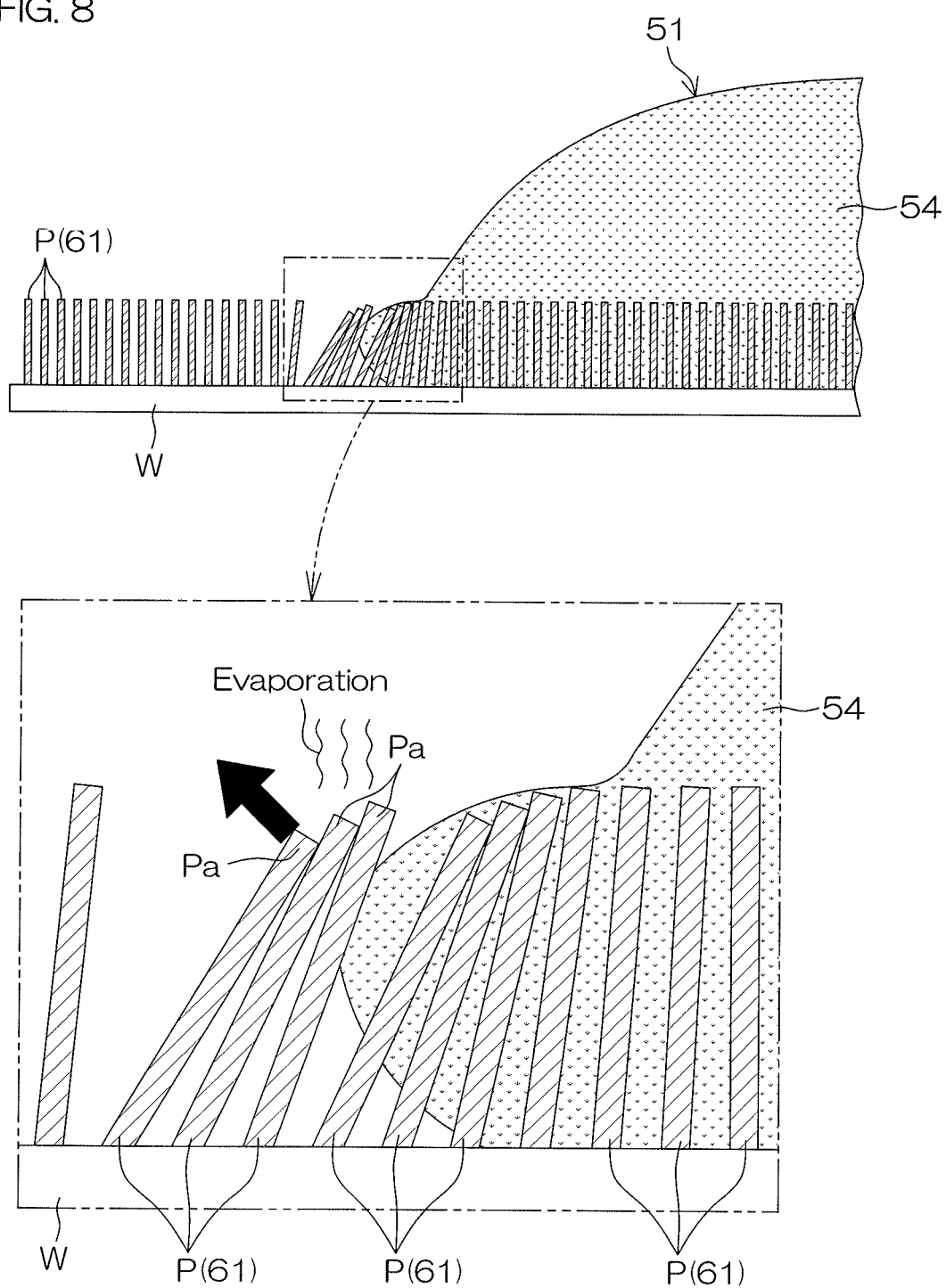
FIG. 8 is a cross-sectional view showing an enlarged view of the state of the front surface of the substrate in the liquid film-removed region enlarging step.

As shown in FIG. 7F, after the liquid film-removed region 52 has enlarged over the entire region of the upper surface of the substrate W, the controller 3 further accelerates rotation of the substrate W to the spin-off drying speed (for example, approximately 1500 rpm). The liquid on the upper surface of the substrate W can thereby be spun off, and the entire upper surface of the substrate W can thereby be dried completely.

When a predetermined period of time from acceleration of rotation of the substrate W has elapsed, the controller 3 controls the spin motor 13 to halt rotation of the spin chuck 5. This completes the drying step (S4 of FIG. 5).

After completion of the drying step (S4 of FIG. 5), the controller 3 controls the heater 8a to halt heat release from the hot plate 8. In addition, the controller 3 controls the facing member lifting unit 37 to raise the shielding plate 27 from the retreat position to the proximal position. The shielded space 38 thereby disappears. Next, the substrate W is carried out by the transfer robot CR.

Thus, according to this preferred embodiment, the liquid film boundary 53 is moved from the center portion of the upper surface of the substrate W to the peripheral edge of the upper surface of the substrate W, while keeping the ambient atmosphere at the liquid film boundary 53 as hydrogen fluoride vapor (HF vapor). When the ambient atmosphere at the liquid film boundary 53 is kept as hydrogen fluoride vapor (HF vapor), the hydrogen fluoride contained in the hydrogen fluoride vapor (HF vapor) reacts with silicon oxides precipitated on the liquid film 51 of the organic solvent/hydrofluoric acid mixture, decomposing the silicon oxides to $H_2SiF_6$ and water.

Thus, the silicon oxides precipitated on the liquid film 51 of the organic solvent/hydrofluoric acid mixture either do not adhere to the tip portion Pa of the pattern P, or the silicon oxides that have adhered to the tip portion Pa of the pattern P (that is, the product 55 (see FIG. 9)) are likewise removed from the tip portion Pa of the pattern P.

Furthermore, in the liquid film-removed region enlarging step T4, the liquid film 51 of the organic solvent/hydrofluoric acid mixture is kept at approximately 70 to 80° C. Consequently, reaction of the hydrogen fluoride contained in the hydrogen fluoride vapor (HF vapor) with silicon oxides forms $H_2SiF_6$ residue. However, the silicon oxides come in liquid contact with the organic solvent/hydrofluoric acid mixture (essentially the organic solvent liquid due to evaporation of hydrofluoric acid) which is present in the liquid film 51 of the organic solvent/hydrofluoric acid mixture and has a liquid temperature of approximately 70 to 80° C., thus promoting evaporation of such residue. Since the melting point of $H_2SiF_6$ is approximately 19° C., evaporation of the residue is accelerated in an environment of approximately 70 to 80° C. It is thereby possible to evaporate the residue and remove the residue from the front surface of the substrate W.

Thus, even if the pattern P instantaneously collapses at each liquid film boundary 53, the collapsed state is not maintained but instead subsequently stands up (is restored) by the elasticity of the pattern P itself. The fact that instantaneous collapse does not leave memory of the collapsed form is also one factor in restoration of the pattern P. Therefore, it is possible to dry the upper surface of the substrate W while effectively reducing collapse of the pattern P.

Figure 10:
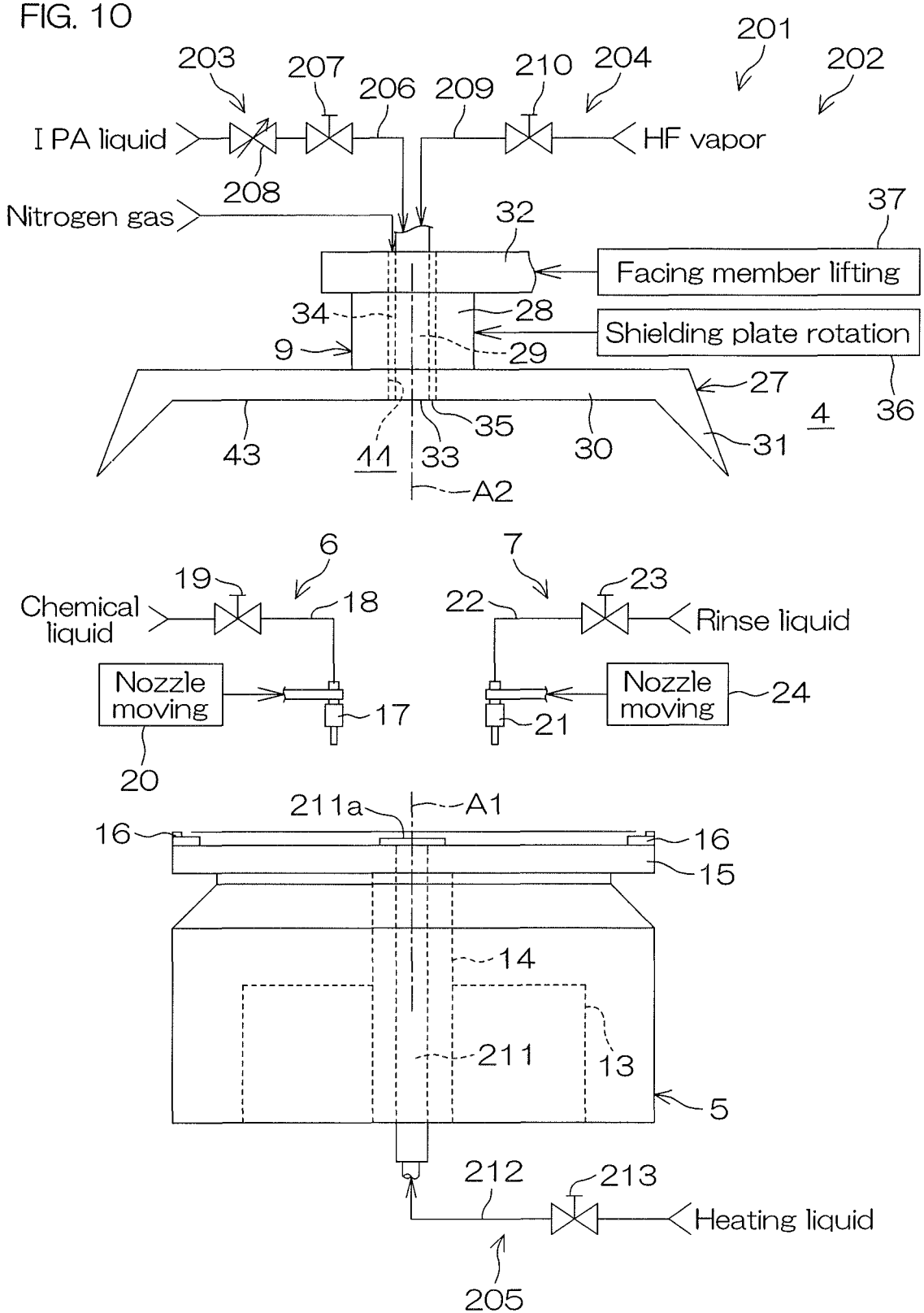
FIG. 10 is an illustrative cross-sectional view for describing a configuration example of a processing unit included in a substrate processing apparatus according to a second preferred embodiment of the present invention.

FIG. 10 is an illustrative cross-sectional view for describing a configuration example of a processing unit 202 included in a substrate processing apparatus 201 according to a second preferred embodiment of the present invention.

For the preferred embodiment represented by the second preferred embodiment, the portions in common with the first preferred embodiment described above are assigned the same reference numerals as in FIG. 1 to FIG. 8, and they will not be explained again.

The processing unit 202 differs from the processing unit 2 according to the first preferred embodiment in that, instead of the organic solvent/hydrofluoric acid mixture supply unit 10 (see FIG. 2), the processing unit 202 includes an organic solvent liquid supply unit 203 arranged to supply IPA (isopropyl alcohol) solution, as an example of an organic solvent liquid having a lower surface tension than water, onto the substrate W that is held by the spin chuck 5, and a hydrogen fluoride vapor supply unit 204 arranged to supply hydrogen fluoride vapor (HF vapor) onto the substrate W that is held by the spin chuck 5. In addition, the processing unit 202 also differs from the processing unit 2 in that, instead of the hot plate 8 as a heating unit, the processing unit 202 includes a lower surface supply unit 205 that supplies hot water, as an example of a heating fluid, to the lower surface of the substrate W that is held by the spin chuck 5 (the rear surface on the side opposite the pattern-formed surface).

The organic solvent liquid supply unit 203 includes an organic solvent liquid line 206 for supplying organic solvent liquid to the upper nozzle 29, an organic solvent liquid valve 207 for opening and closing of the organic solvent liquid line 206, and a flow adjusting valve 208 for adjusting of the aperture of the organic solvent liquid line 206 to adjust the discharge flow rate of the organic solvent liquid from the upper nozzle 29. While not shown here, the flow adjusting valve 208 includes a valve body with a valve seat provided inside it, a valve element that opens and closes the valve seat, and an actuator that moves the valve element between the open position and the closed position. The same applies for the other flow adjusting valves.

The hydrogen fluoride vapor supply unit 204 includes a hydrogen fluoride vapor line 209 for supplying hydrogen fluoride vapor (HF vapor) to the upper nozzle 29, and a hydrogen fluoride vapor valve 210 for opening and closing of the hydrogen fluoride vapor line 209. The hydrogen fluoride vapor (HF vapor) supplied to the hydrogen fluoride vapor line 209 may contain a carrier gas (for example, an inert gas such as nitrogen gas).

When the organic solvent liquid valve 207 is opened with the hydrogen fluoride vapor valve 210 in the closed state, the organic solvent liquid is supplied to the upper nozzle 29, and the organic solvent liquid at ordinary temperature, for example, is discharged downward from the center portion discharge port 33.

On the other hand, when the hydrogen fluoride vapor valve 210 is opened with the organic solvent liquid valve 207 in the closed state, the hydrogen fluoride vapor is supplied to the upper nozzle 29, and the hydrogen fluoride vapor (HF vapor) is discharged downward from the center portion discharge port 33. The discharge flow rate of the hydrogen fluoride vapor from the center portion discharge port 33 can be changed by adjusting of the aperture of the flow adjusting valve 208.

The lower surface supply unit 205 includes a lower surface nozzle 211 that discharges a heating fluid upward, a heating fluid line 212 that guides the heating fluid to the lower surface nozzle 211, and a heating fluid valve 213 provided in the heating fluid line 212. At the upper end of the lower surface nozzle 211, there is formed a discharge port 211*a* facing the center portion of the lower surface (rear surface) of the substrate W held by the spin chuck 5. When the heating fluid valve 213 is opened, the heating fluid is discharged upward from the discharge port 211*a*.

In this preferred embodiment, the heating fluid is a heating liquid that has been heated to a temperature (approximately 70 to 80° C.) that is near high temperature (for example, the boiling point of IPA (approximately 82.4° C.)). The type of heating liquid may be purified water (DIW), but it may instead be carbonated water, electrolytic ion water, hydrogen water, ozone water, IPA (isopropyl alcohol) or hydrochloric acid water at diluted concentration (for example, approximately 10 to 100 ppm), etc. Instead of a heating liquid, a heating gas that has been heated to a temperature (approximately 70 to 80° C.) near a high heating temperature (for example, the boiling point of IPA (approximately 82.4° C.)) may be discharged.

Figure 11:
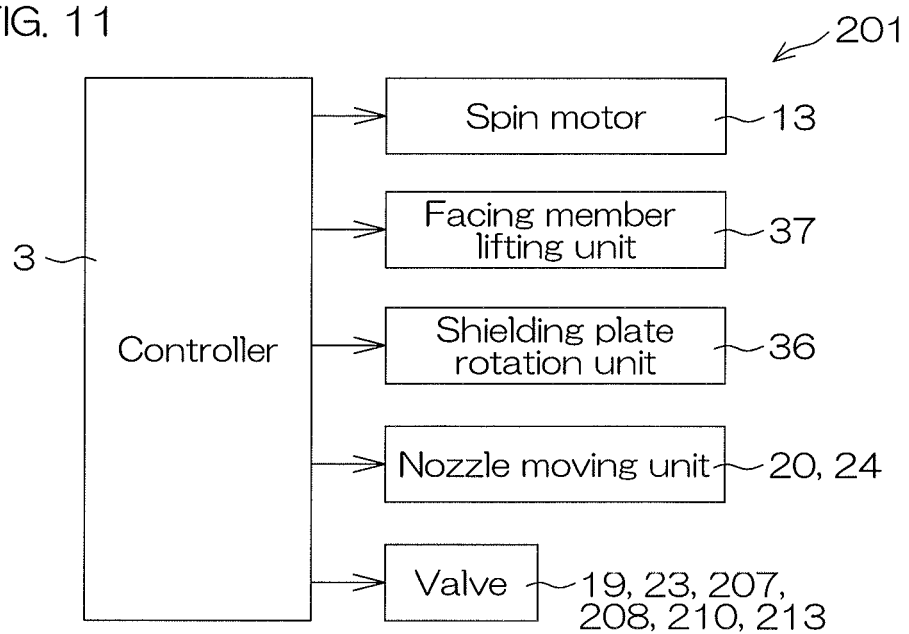
FIG. 11 is a block diagram for describing an electrical configuration of the main portion of the substrate processing apparatus.

FIG. 11 is a block diagram for describing the electrical configuration of the main portion of a substrate processing apparatus 201.

The controller 3 controls operations of the spin motor 13, the facing member lifting unit 37, the shielding plate rotation unit 36, the first nozzle moving unit 20, the second nozzle moving unit 24, etc., according to a predetermined program. The controller 3 also opens and closes the chemical liquid valve 19, the rinse liquid valve 23, the organic solvent liquid valve 207, the hydrogen fluoride vapor valve 210, the heating fluid valve 213, etc., according to a predetermined program. In addition, the controller 3 adjusts the aperture of the flow adjusting valve 208 according to a predetermined program.

Figure 12:
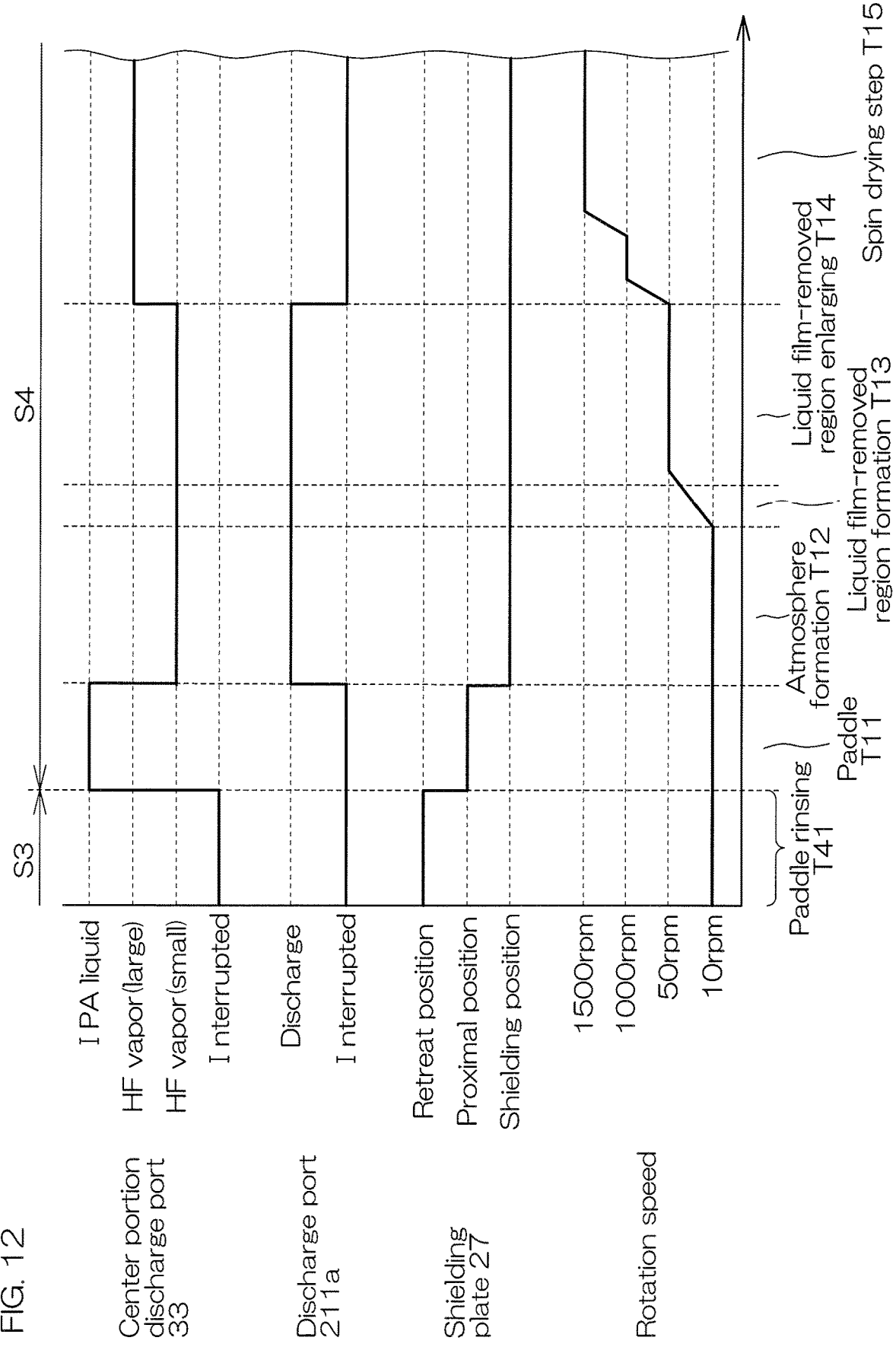
FIG. 12 is a timing chart for describing a rinsing step and a drying step included in a second substrate processing example carried out by the substrate processing apparatus.

FIG. 12 is a timing chart for describing the rinsing step (S3 of FIG. 5) and drying step (S4 of FIG. 5) included in the second substrate processing example that is carried out at the substrate processing apparatus 201. FIGS. 13A to 13F are illustrative cross-sectional views for describing the drying step (S4 of FIG. 5).

The second substrate processing example, similar to the first substrate processing example, includes steps corresponding to each of the steps S1 to S5 of FIG. 5.

The second substrate processing example will now be described with reference to FIG. 10 to FIG. 12, focusing on the portions differing from the first substrate processing example. FIG. 13A to 13F will also be referred to as appropriate.

The drying step (S4 of FIG. 5) according to the second substrate processing example includes a paddle step T11 of holding a liquid film 251 of the organic solvent liquid (liquid film of the processing liquid) on the upper surface of the substrate W (see FIG. 12), an atmosphere-forming step T12 of filling (forming) an atmosphere containing a large amount of hydrogen fluoride vapor in the shielded space 38 (see FIG. 12), a liquid film-removed region-forming step T13 of partially eliminating the organic solvent liquid from the liquid film 251 of the organic solvent liquid, to form a circular liquid film-removed region 252 at the center portion of the liquid film 251 of the organic solvent liquid (see FIG. 12), a liquid film-removed region enlarging step T14 of enlarging the liquid film-removed region 252 toward the outer periphery of the substrate W (see FIG. 12), and a spin drying step T15 of rotating the substrate W at a spin-off drying speed to dry the upper surface of the substrate W (see FIG. 12).

The drying step according to the second substrate processing example (S4 of FIG. 5) will now be explained in detail.

Figure 13A:
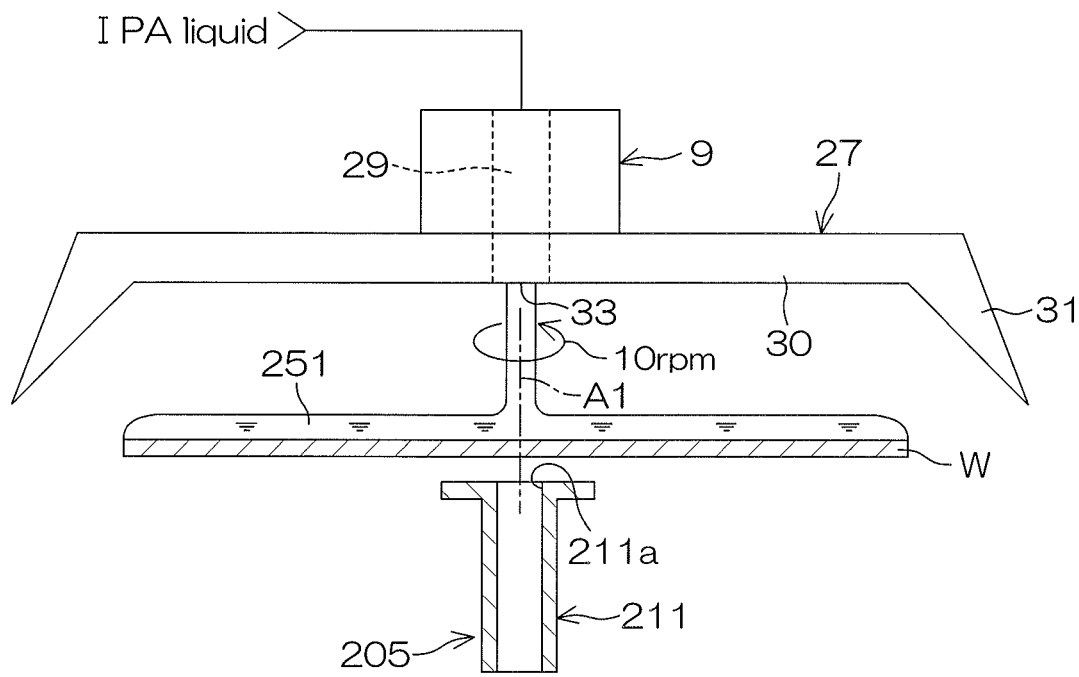
FIG. 13A is an illustrative cross-sectional view for describing a paddle step (T11 of FIG. 12).
Figure 13B:
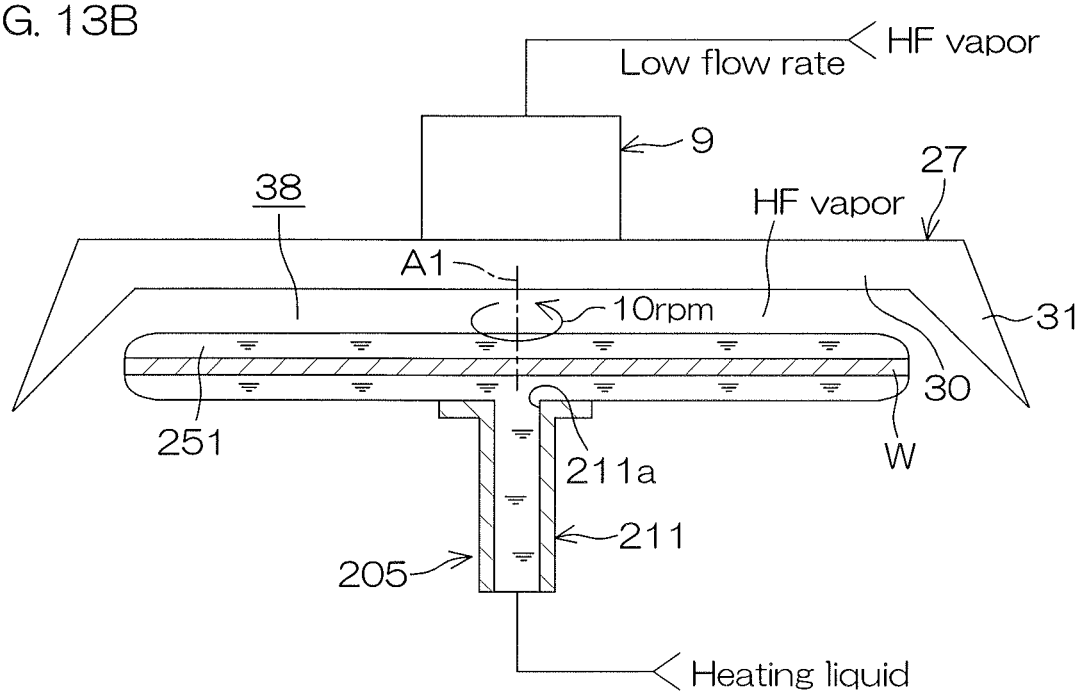
FIG. 13B is an illustrative cross-sectional view for describing an atmosphere-forming step (T12 of FIG. 12).

Before starting the paddle step T11, the controller 3 controls the facing member lifting unit 37 to lower the shielding plate 27 from the retreat position to the proximal position. After the shielding plate 27 has been disposed at the proximal position, the controller 3 closes the hydrogen fluoride vapor valve 210 and opens the organic solvent liquid valve 207, discharging the organic solvent liquid from the center portion discharge port 33 of the shielding plate 27, while maintaining rotation of the substrate W at the paddle speed. As a result, the rinse liquid included in the liquid film on the upper surface of the substrate W is successively replaced with the organic solvent liquid. Thus, as shown in FIG. 13A, the liquid film 251 of the organic solvent liquid covering the entire region of the upper surface of the substrate W is held in a paddle form on the upper surface of the substrate W (paddle step T11). The thickness of the bulk portion of the liquid film 251 of the organic solvent liquid is greater than the height of the pattern P. When almost all of the liquid film over the entire region of the upper surface of the substrate W has been replaced with the liquid film 251 of the organic solvent liquid, the controller 3 closes the organic solvent liquid valve 207, interrupting discharge of the organic solvent liquid from the center portion discharge port 33. The paddle step T11 is thus completed.

When a silicon substrate is used as the substrate W, silicon oxides may potentially precipitate on the liquid film 251 of the organic solvent liquid. Such silicon oxides are formed in the chemical liquid step (S2 of FIG. 5) for the substrate W, and remain on the substrate W up to the drying step (S4 of FIG. 5).

After discharge of the organic solvent liquid has been interrupted, the controller 3 controls the facing member lifting unit 37 to lower the shielding plate 27 from the proximal position to the shielding position. Thus, a shielded space 38 (see FIG. 13B) is formed between the substrate-facing surface 43 and the upper surface of the substrate W.

Also, after discharge of the organic solvent liquid has been interrupted, the controller 3 opens the heating fluid valve 213. As a result, the heating fluid is discharged upward from the discharge port 211a of the lower surface nozzle 211, and the heating fluid is supplied to the lower surface (rear surface) of the substrate W. Thus, the heating fluid that has been discharged from the discharge port 211a of the lower surface nozzle 211 lands on the lower surface of the substrate W, forming a liquid film of the heating fluid covering the lower surface of the substrate W. As a result, the substrate W is heated from the lower surface side, and the liquid film 251 of the organic solvent liquid on the substrate W increases in temperature. As a result of the heating, the liquid film 251 of the organic solvent liquid on the substrate W is heated to approximately 70 to 80° C. (a prescribed temperature higher than the melting point of $H_2SiF_6$ (approximately 19° C.) and lower than the boiling point of IPA (approximately 82.4° C.)). The discharge flow rate of the heating fluid from the lower surface nozzle 211 is set to a level such that the heating fluid does not flow around to the front surface side from the peripheral edge portions of the substrate W. By increasing the temperature of the organic solvent liquid included in the liquid film 251 of the organic solvent liquid, the replacement performance from the rinse liquid to the organic solvent can be increased.

The controller 3 closes the organic solvent liquid valve 207 and opens the hydrogen fluoride vapor valve 210, discharging the hydrogen fluoride vapor from the center portion discharge port 33 of the shielding plate 27, while maintaining rotation of the substrate W at the paddle speed. The discharge flow rate of the hydrogen fluoride vapor during this time is a low flow rate (for example, approximately 5 (liters/minute)). By discharging hydrogen fluoride vapor (HF vapor) from the center portion discharge port 33 for a prescribed time period, the shielded space 38 becomes filled with the hydrogen fluoride vapor (HF vapor) (atmosphere-forming step T12).

Figure 13C:
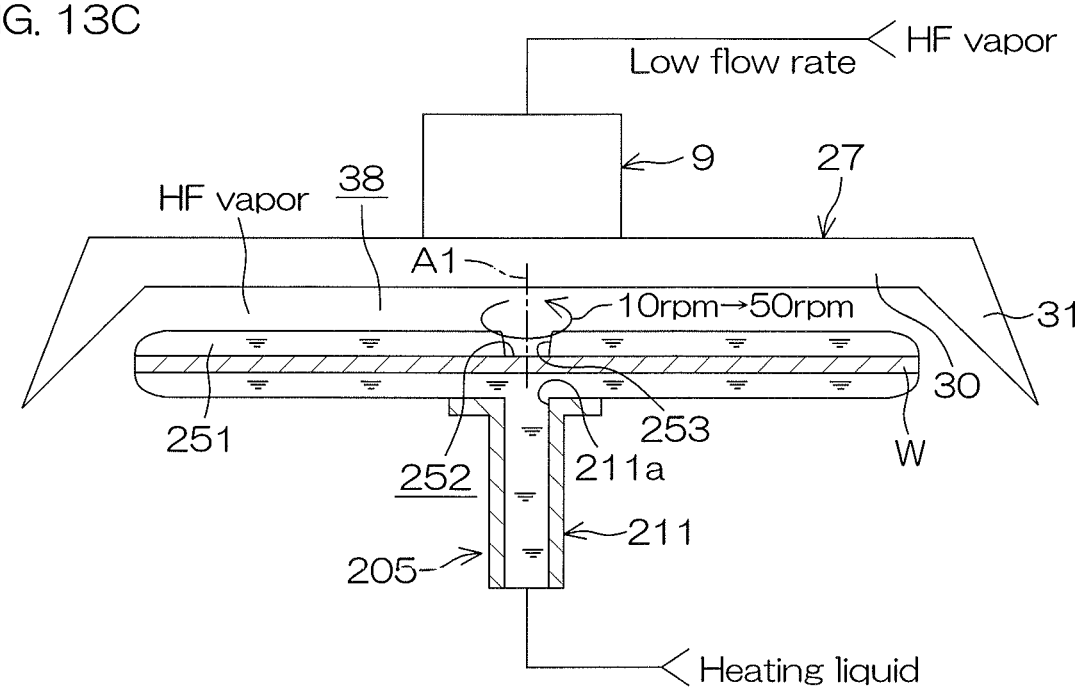
FIG. 13C is an illustrative cross-sectional view for describing a liquid film-removed region-forming step (T13 of FIG. 12).

When a predetermined period of time from completion of the paddle step T11 has elapsed, the controller 3 controls the spin motor 13 to accelerate the rotational speed of the substrate W. Specifically, the controller 3 gradually increases the rotational speed of the substrate W toward the first rotational speed (for example, approximately 50 rpm). As the rotational speed of the substrate W increases, the centrifugal force due to rotation of the substrate W becomes greater and therefore the organic solvent liquid at the center portion of the substrate W is pushed away outward. Thus, as shown in FIG. 13C, the liquid film 251 of the organic solvent liquid is partially removed at the center portion of the substrate W. As a result, a small circular liquid film-removed region 252 is formed at the center portion of the substrate W (liquid film-removed region-forming step T13). Formation of the liquid film-removed region 252 occurs with the shielded space 38 in a state filled with hydrogen fluoride vapor (HF vapor). That is, the ambient atmosphere of the liquid film 251 of the organic solvent liquid at a boundary 253 with the liquid film-removed region 252 (hereinafter referred to as "liquid film boundary 253") is kept as a hydrogen fluoride vapor (HF vapor) atmosphere.

Figure 13D:
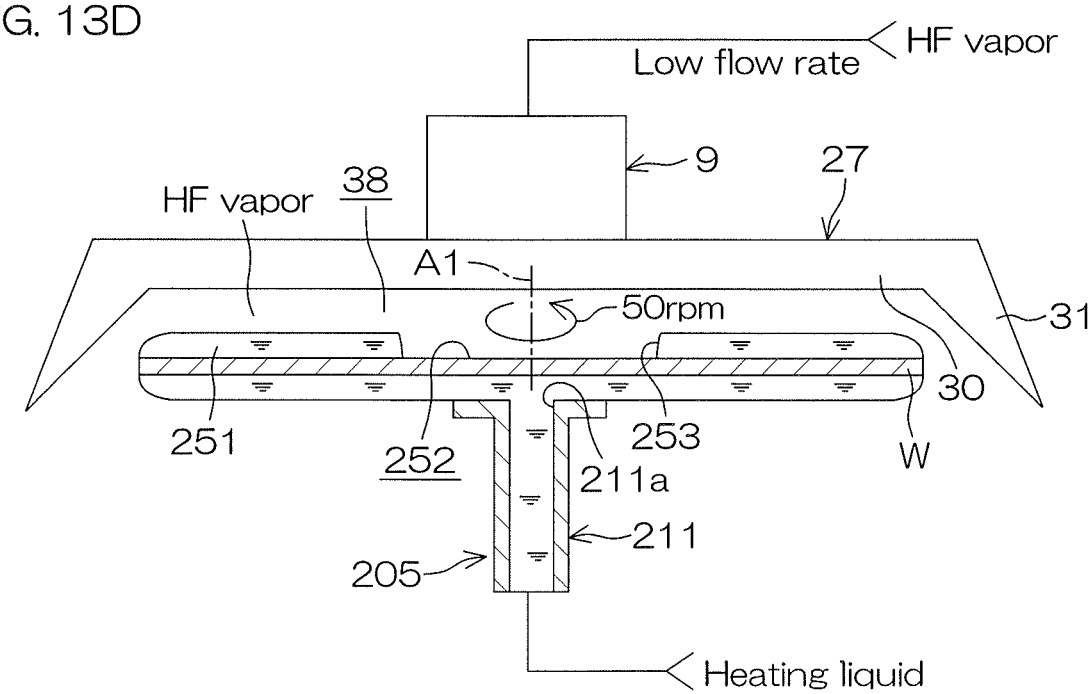
FIG. 13D is an illustrative cross-sectional view for describing a liquid film-removed region enlarging step (T14 of FIG. 12).
Figure 13E:
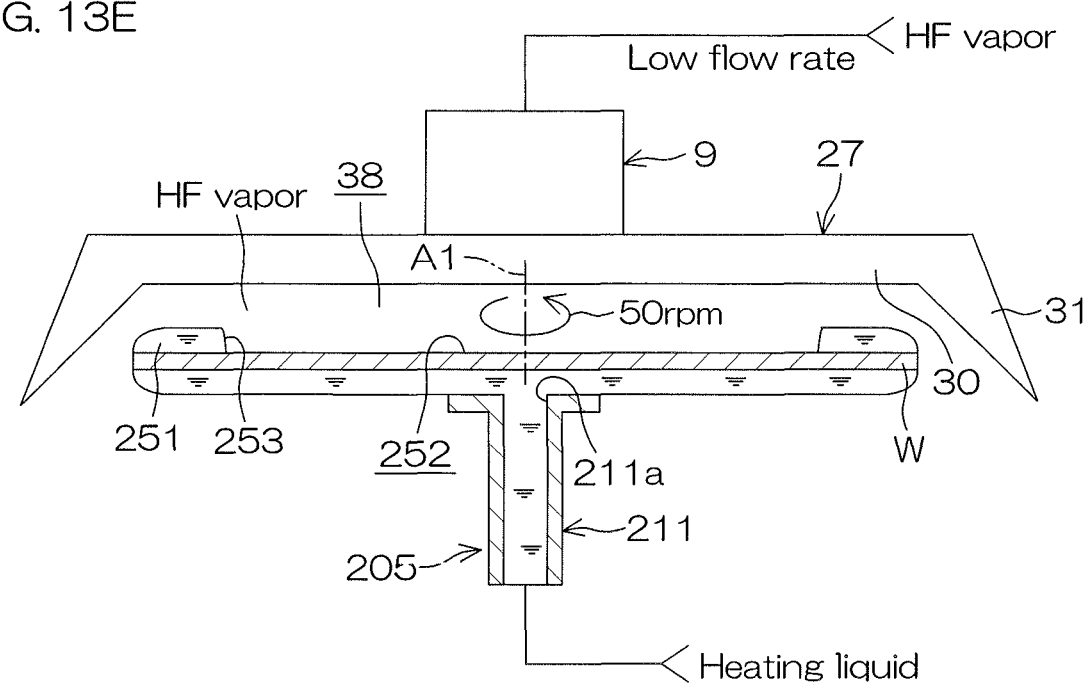
FIG. 13E is a diagram showing the state continuing to FIG. 13D, in the liquid film-removed region enlarging step.

After formation of the liquid film-removed region 252, the controller 3 controls the spin motor 13 to keep the rotational speed of the substrate W at the first rotational speed (for example, approximately 50 rpm). The liquid film-removed region 252 gradually enlarges as a result (liquid film-removed region enlarging step T14). As the liquid film-removed region 252 enlarges, as shown in FIG. 13D, the liquid film boundary 253 is moved toward the radially outer side. As shown in FIG. 13E, in the liquid film-removed region enlarging step T14, the liquid film-removed region 252 enlarges to the entire region of the upper surface of the substrate W. That is, the liquid film boundary 253 also is moved up to the peripheral edge of the upper surface of the substrate W. Enlargement of the liquid film-removed region 252 also occurs with the shielded space 38 in a state filled with hydrogen fluoride vapor (HF vapor) (hydrogen fluoride atmosphere-holding step). That is, the liquid film boundary 253 is moved from the center portion of the substrate W to the peripheral edge of the upper surface of the substrate W, while keeping the ambient atmosphere at the liquid film boundary 253 as hydrogen fluoride vapor (HF vapor).

In the liquid film-removed region enlarging step T14, as the liquid film boundary 253 moves, the organic solvent liquid is successively removed from between sections of the pattern P on the front surface of the substrate W (see FIG. 4), from the center portion of the substrate W toward the peripheral edge of the upper surface of the substrate W. A difference is produced in the surface tension acting on the pattern P through which the liquid film boundary 253 passes, whereby the pattern P instantaneously collapses toward the bulk portion side (that is, outward from the substrate W).

In the second substrate processing example, the liquid film boundary 253 is moved from the center portion of the upper surface of the substrate W to the peripheral edge of the upper surface of the substrate W, while keeping the ambient atmosphere at the liquid film boundary 253 as hydrogen fluoride vapor (HF vapor). When the ambient atmosphere at the liquid film boundary 253 is kept as hydrogen fluoride vapor (HF vapor), the hydrogen fluoride contained in the hydrogen fluoride vapor (HF vapor) reacts with silicon oxides precipitated on the liquid film 251 of the organic solvent liquid, decomposing the silicon oxides to $H_2SiF_6$ and water.

Consequently, the hydrogen fluoride contained in the ambient atmosphere at the liquid film boundary 253 reacts with the silicon oxides precipitated on the liquid film 251 of the organic solvent liquid. As a result, the silicon oxides precipitated on the liquid film 251 of the organic solvent liquid either do not adhere to the tip portion Pa of the pattern P (see FIG. 4), or the silicon oxides that have adhered to the tip portion Pa of the pattern P (that is, the product 55 (see FIG. 9)) are likewise removed from the tip portion Pa of the pattern P.

Furthermore, in the liquid film-removed region enlarging step T14, the liquid film 251 of the organic solvent liquid is kept at approximately 70 to 80° C. Consequently, reaction of the hydrogen fluoride contained in the hydrogen fluoride vapor (HF vapor) with silicon oxides forms $H_2SiF_6$ residue. However, the silicon oxides come in liquid contact with the organic solvent liquid which is present in the liquid film 251 of the organic solvent liquid and has a liquid temperature of approximately 70 to 80° C., thus promoting evaporation of such residue. Since the melting point of $H_2SiF_6$ is approximately 19° C., evaporation of the residue is accelerated in an environment of approximately 70 to 80° C. It is thereby possible to evaporate the residue and remove the residue from the front surface of the substrate W.

In addition, since the liquid temperature of the liquid film 251 of the organic solvent liquid is higher than the melting point of $H_2SiF_6$ (approximately 19° C.) and lower than the boiling point of IPA (approximately 82.4° C.), it is possible to satisfactorily remove the $H_2SiF_6$ residue while maintaining the liquid film 251 of the organic solvent liquid in the film state.

Figure 13F:
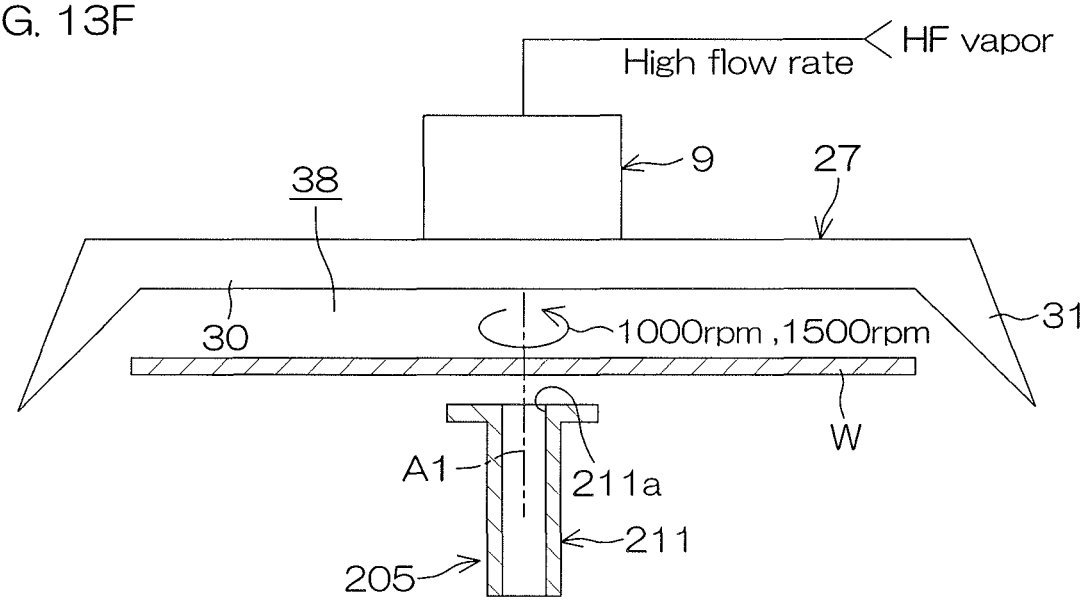
FIG. 13F is an illustrative cross-sectional view for describing a spin drying step (T15 of FIG. 12).

As shown in FIG. 13F, after the liquid film-removed region 252 has enlarged over the entire region of the upper surface of the substrate W, the controller 3 closes the heating fluid valve 213 to interrupt discharge of the heating fluid to the lower surface of the substrate W. In addition, the controller 3 adjusts the aperture of the flow adjusting valve 208 to increase the discharge flow rate of the hydrogen fluoride vapor (HF vapor) discharged from the center portion discharge port 33 to a high flow rate (for example, approximately 150 (liters/minute)). Also, the controller 3 further accelerates rotation of the substrate W to the spin-off drying speed (for example, approximately 1500 rpm). The liquid on the upper surface of the substrate W can thereby be spun off, and the entire upper surface of the substrate W can thereby be dried completely.

Upon completion of the drying step (S4 of FIG. 5), the controller 3 controls the facing member lifting unit 37 to raise the shielding plate 27 from the retreat position to the proximal position. The shielded space 38 thereby disappears. The controller 3 also closes the hydrogen fluoride vapor valve 210 to interrupt discharge of the hydrogen fluoride vapor (HF vapor) from the center portion discharge port 33. Next, the substrate W is carried out by the transfer robot CR.

Thus, according to the second preferred embodiment, actions and effects are exhibited that are equivalent to the actions and effects explained in relation to the first preferred embodiment.

FIG. 14 is an illustrative cross-sectional view for describing a configuration example of a processing unit 302 included in a substrate processing apparatus 301 according to a third preferred embodiment of the present invention.

For the preferred embodiment represented by the third preferred embodiment, the portions in common with the second preferred embodiment described above are assigned the same reference numerals as in FIG. 10 to FIG. 13F, and they will not be explained again.

The processing unit 302 differs from the processing unit 202 according to the second preferred embodiment in that, instead of the organic solvent liquid supply unit 203 (see FIG. 10) and the hydrogen fluoride vapor supply unit 204 (see FIG. 10), the processing unit 302 includes an organic solvent liquid supply unit 303 arranged to supply vapor containing IPA (isopropyl alcohol), as an example of an organic solvent liquid having a lower surface tension than water (hereinafter referred to as "organic solvent vapor"), onto the substrate W that is held by the spin chuck 5, and a hydrogen fluoride vapor supply unit 304 arranged to supply hydrogen fluoride vapor (HF vapor) onto the substrate W that is held by the spin chuck 5. In addition, the processing unit 202 includes, as a heating unit instead of the hot plate 8, a lower surface supply unit 205 that supplies hot water, as an example of a heating fluid, to the lower surface of the substrate W that is held by the spin chuck 5 (the rear surface on the side opposite the pattern-formed surface).

Also, the processing unit 302 differs from the processing unit 202 in that, instead of the rinse liquid supply unit 7, the processing unit 302 includes a rinse liquid supply unit 305 arranged to supply rinse liquid onto the substrate W that is held by the spin chuck 5.

The organic solvent liquid supply unit 303 includes an organic solvent vapor line 306 for supplying organic solvent vapor to the upper nozzle 29, an organic solvent vapor valve 307 for opening and closing of the organic solvent vapor line 306, and a flow adjusting valve 308 for adjusting of the aperture of the organic solvent vapor line 306 to adjust the supply flow rate of the organic solvent vapor to the upper nozzle 29. The organic solvent vapor supplied to the organic solvent vapor line 306 may include a carrier gas (for example, an inert gas such as nitrogen gas).

The hydrogen fluoride vapor supply unit 304 includes a hydrogen fluoride vapor line 309 for supplying hydrogen fluoride vapor (HF vapor) to the upper nozzle 29, a hydrogen fluoride vapor valve 310 for opening and closing of the hydrogen fluoride vapor line 309, and a flow adjusting valve 311 for adjusting of the aperture of the hydrogen fluoride vapor line 309 to adjust the supply flow rate of the hydrogen fluoride vapor to the upper nozzle 29. The hydrogen fluoride vapor (HF vapor) supplied to the hydrogen fluoride vapor line 309 may contain a carrier gas (for example, an inert gas such as nitrogen gas).

The rinse liquid supply unit 305 includes a rinse liquid line 312 for supplying rinse liquid to the upper nozzle 29, and a rinse liquid valve 313 for opening and closing of the rinse liquid line 312.

By simultaneously opening the organic solvent vapor valve 307 and the hydrogen fluoride vapor valve 310 with the rinse liquid valve 313 in the closed state, organic solvent vapor and hydrogen fluoride vapor are supplied to the upper nozzle 29, and organic solvent/hydrogen fluoride mixture vapor (IPA/HF vapor), containing organic solvent and hydrogen fluoride, is discharged downward from the center portion discharge port 33. Also, the discharge flow rate of the organic solvent/hydrogen fluoride mixture vapor (IPA/HF vapor) from the center portion discharge port 33 can be changed by adjusting the aperture of the flow adjusting valve 308 and adjusting the aperture of the flow adjusting valve 311.

On the other hand, when the rinse liquid valve 313 is opened with the organic solvent vapor valve 307 and the hydrogen fluoride vapor valve 310 in the closed state, the rinse liquid is supplied to the upper nozzle 29, and the rinse liquid is discharged downward from the center portion discharge port 33.

Figure 15:
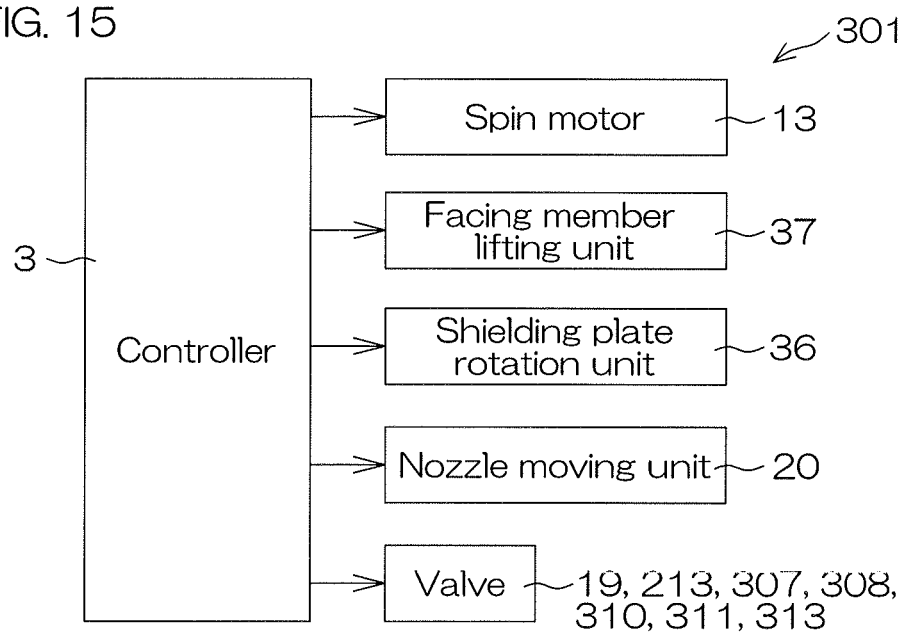
FIG. 15 is a block diagram for describing an electrical configuration of the main portion of the substrate processing apparatus.

FIG. 15 is a block diagram for describing the electrical configuration of the main portion of the substrate processing apparatus 301.

The controller 3 controls operations of the spin motor 13, the facing member lifting unit 37, the shielding plate rotation unit 36, the first nozzle moving unit 20, etc., according to a predetermined program. The controller 3 also opens and closes the chemical liquid valve 19, the rinse liquid valve 23, the heating fluid valve 213, the organic solvent vapor valve 307, the hydrogen fluoride vapor valve 310, the rinse liquid valve 313, etc., according to a predetermined program. In addition, the controller 3 adjusts the aperture of the flow adjusting valves 308, 311, according to a predetermined program.

Figure 16:
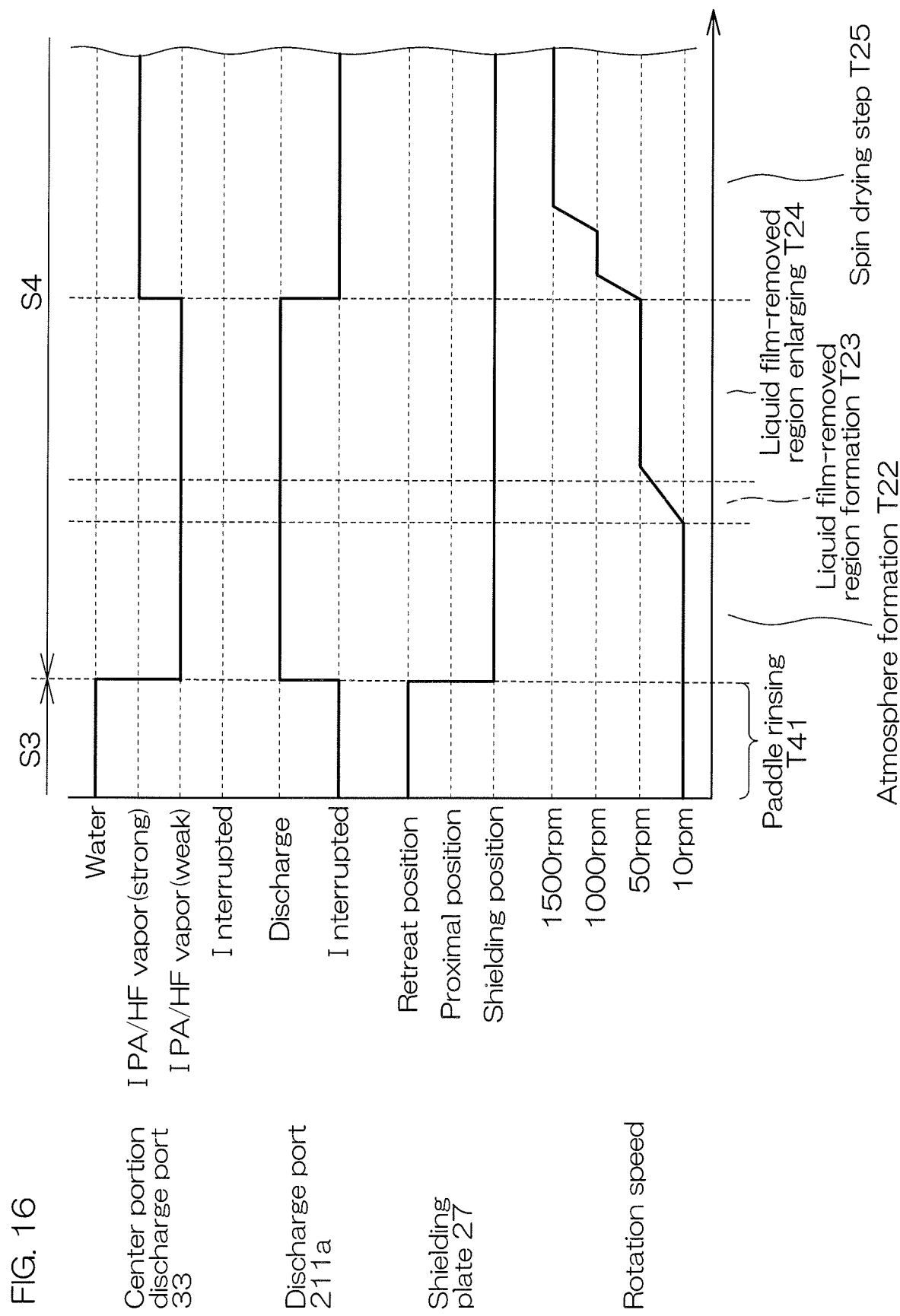
FIG. 16 is a timing chart for describing the rinsing step and drying step carried out by the substrate processing apparatus.

FIG. 16 is a timing chart for describing the rinsing step (S3 of FIG. 5) and drying step (S4 of FIG. 5) included in the third substrate processing example that is carried out at the substrate processing apparatus 301. FIGS. 17A to 17F are illustrative cross-sectional views for describing the drying step (S4 of FIG. 5).

The third substrate processing example, similar to the first substrate processing example and second substrate processing example, includes steps corresponding to each of the steps S1 to S5 of FIG. 5.

The third substrate processing example will now be described with reference to FIG. 14 to FIG. 16, focusing on the portions differing from the second substrate processing example. FIG. 17A to 17F will also be referred to as appropriate.

Figure 17A:
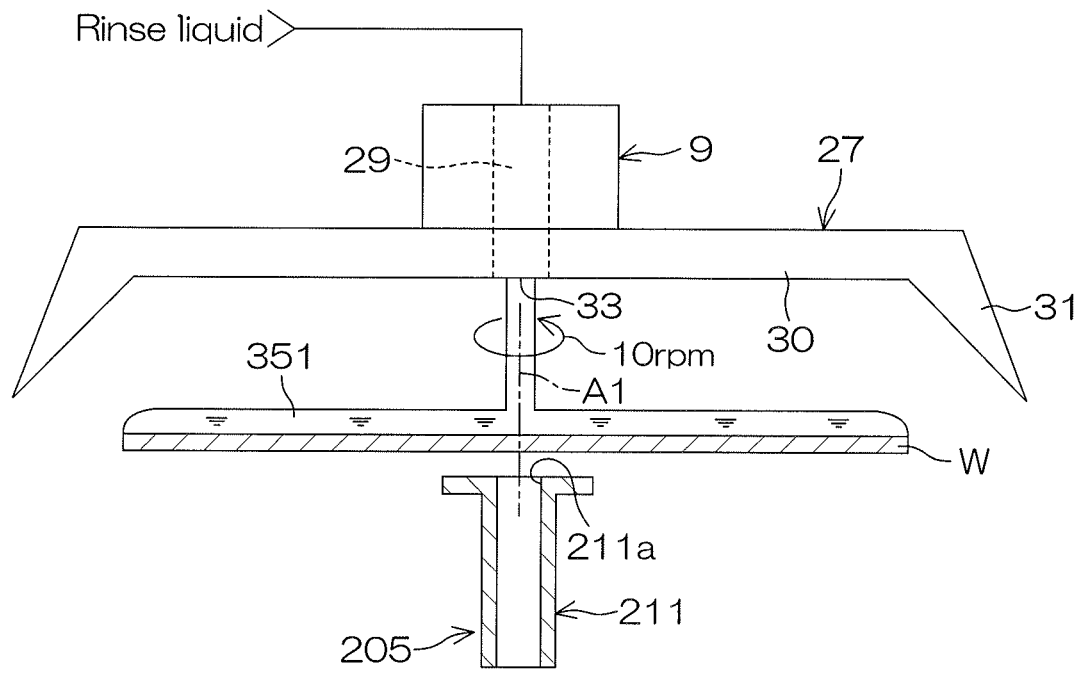
FIG. 17A is an illustrative cross-sectional view for describing the paddle step (T21 of FIG. 16).
Figure 17B:
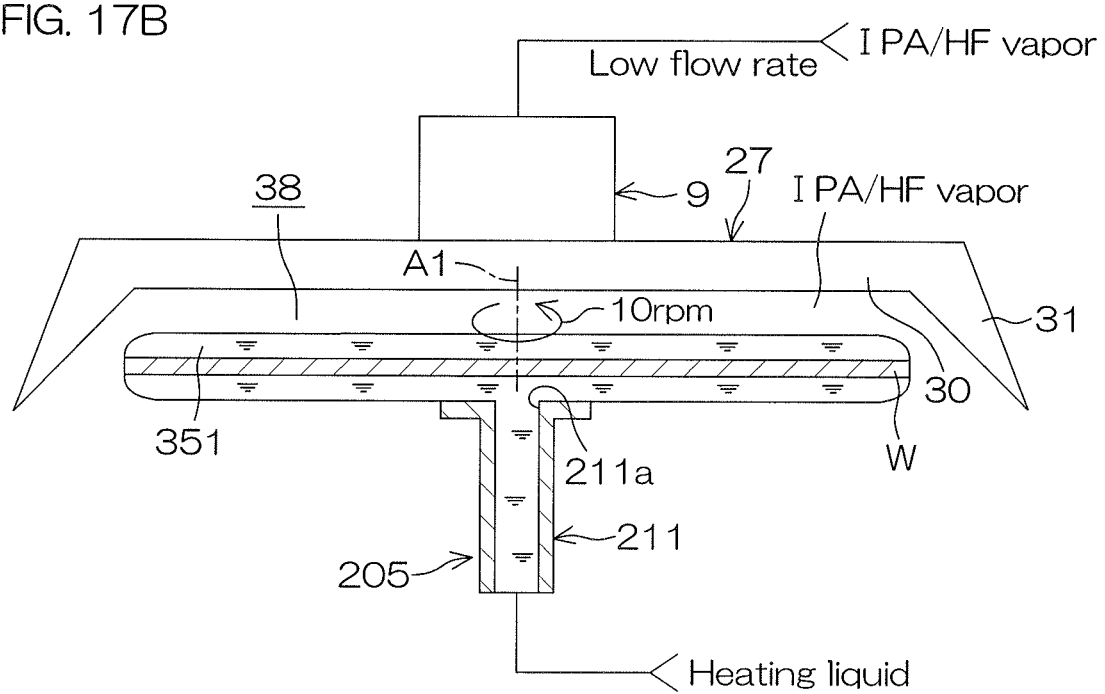
FIG. 17B is an illustrative cross-sectional view for describing the atmosphere-forming step (T22 of FIG. 16).

In the rinsing step according to the second substrate processing example (S3 of FIG. 5; including the paddle rinsing step T41), the rinse liquid discharged from the center portion discharge port 33 is used to execute rinse processing of the upper surface of the substrate W. Specifically, the controller 3 closes the organic solvent vapor valve 307 and the hydrogen fluoride vapor valve 310, and opening the rinse liquid valve 313. The rinse liquid is thereby discharged from the center portion discharge port 33. In the paddle rinsing step T41, the rotational speed of the substrate W is kept at the paddle speed. Thus, as shown in FIG. 17A, a liquid film 351 of the rinse liquid (liquid film of the processing liquid) covering the entire region of the upper surface of the substrate W is held in a paddle form on the upper surface of the substrate W. The thickness of the bulk portion of the liquid film 351 of the rinse liquid is greater than the height of the pattern P. When a predetermined period of time from deceleration of the substrate W to the paddle speed has elapsed, the controller 3 closes the rinse liquid valve 313 to interrupt discharge of the rinse liquid from the center portion discharge port 33. The drying step is then carried out (S4 of FIG. 5).

The drying step according to the third substrate processing example (S4 of FIG. 5) includes an atmosphere-forming step T22 of filling (forming) an atmosphere containing a large amount of organic solvent/hydrogen fluoride mixture vapor (IPA/HF vapor) in the shielded space 38 (see FIG. 16), a liquid film-removed region-forming step T23 of partially eliminating the organic solvent liquid from the liquid film 351 of the rinse liquid, to form a circular liquid film-removed region 352 at the center portion of the liquid film 351 of the rinse liquid (see FIG. 16), a liquid film-removed region enlarging step T24 of enlarging the liquid film-removed region 352 toward the outer periphery of the substrate W (see FIG. 16), and a spin drying step T25 of rotating the substrate W at a spin-off drying speed to dry the upper surface of the substrate W (see FIG. 16). That is, the drying step according to the third substrate processing example (S4 of FIG. 5) does not include a step corresponding to the paddle step T1 (see FIG. 6) or paddle step T11 (see FIG. 12).

The drying step according to the third substrate processing example (S4 of FIG. 5) will now be explained in detail.

When a silicon substrate is used as the substrate W, silicon oxides may potentially precipitate on the liquid film 351 of the rinse liquid. Such silicon oxides are formed in the chemical liquid step (S2 of FIG. 5) for the substrate W, and remain on the substrate W up to the drying step (S4 of FIG. 5).

Before starting the atmosphere-forming step T22, the controller 3 controls the facing member lifting unit 37 to lower the shielding plate 27 from the retreat position to the shielding position. Thus, a shielded space 38 (see FIG. 17B) is formed between the substrate-facing surface 43 and the upper surface of the substrate W.

Also, after discharge of the organic solvent liquid has been interrupted, the controller 3 opens the heating fluid valve 213. As a result, the substrate W is heated from the lower surface side, and the liquid film 351 of the rinse liquid on the substrate W increases in temperature to approximately 70 to 80° C.

The controller 3 closes the rinse liquid valve 313 and simultaneously opens the organic solvent vapor valve 307 and hydrogen fluoride vapor valve 310, discharging the organic solvent/hydrogen fluoride mixture vapor (IPA/HF vapor) from the center portion discharge port 33 of the shielding plate 27, while maintaining rotation of the substrate W at the paddle speed. The discharge flow rate of the organic solvent/hydrogen fluoride mixture vapor (IPA/HF vapor) during this time is a low flow rate (for example, approximately 5 (liters/minute)). By discharging the organic solvent/hydrogen fluoride mixture vapor (IPA/HF vapor) from the center portion discharge port 33 for a prescribed time period, the shielded space 38 becomes filled with the organic solvent/hydrogen fluoride mixture vapor (IPA/HF vapor) (atmosphere-forming step T22).

Figure 17C:
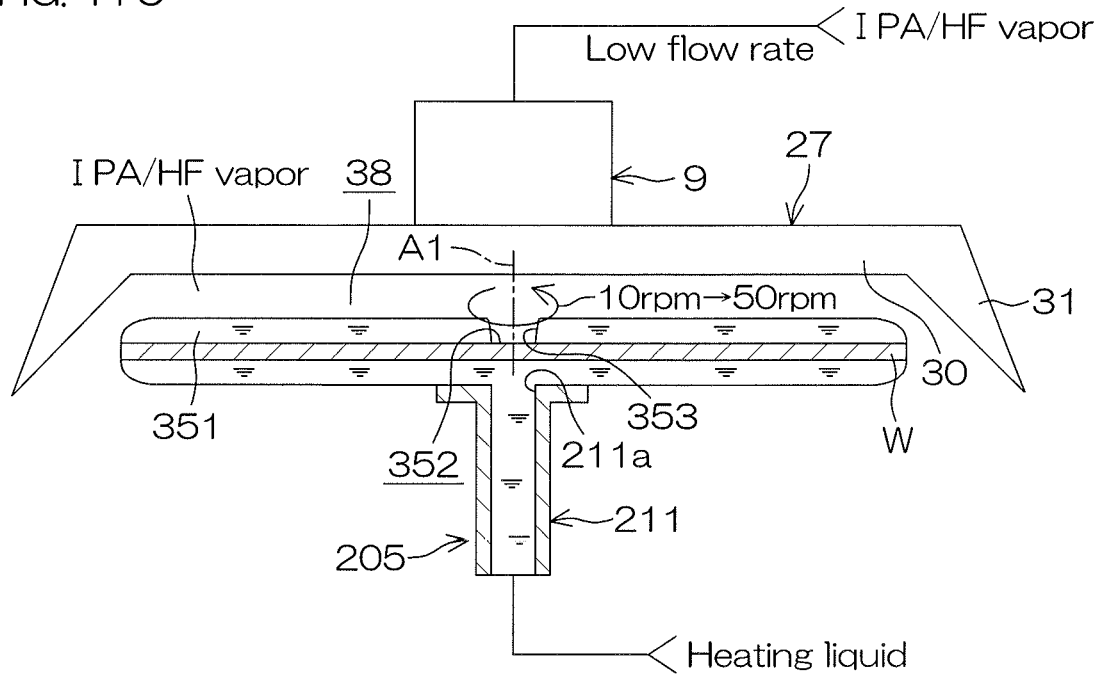
FIG. 17C is an illustrative cross-sectional view for describing the liquid film-removed region-forming step (T23 of FIG. 16).

When a predetermined period of time from completion of the paddle rinsing step T41 has elapsed, the controller 3 controls the spin motor 13 to accelerate the rotational speed of the substrate W. Specifically, the controller 3 gradually increases the rotational speed of the substrate W toward the first rotational speed (for example, approximately 50 rpm). As the rotational speed of the substrate W increases, the centrifugal force due to rotation of the substrate W becomes greater and therefore the organic solvent liquid at the center portion of the substrate W is pushed away outward. Thus, as shown in FIG. 17C, the liquid film 351 of the rinse liquid is partially removed at the center portion of the substrate W. As a result, a small circular liquid film-removed region 352 is formed at the center portion of the substrate W (liquid film-removed region-forming step T23). Formation of the liquid film-removed region 352 occurs with the shielded space 38 in a state filled with the organic solvent/hydrogen fluoride mixture vapor (IPA/HF vapor). That is, the ambient atmosphere of the liquid film 351 of the rinse liquid at a boundary 353 with the liquid film-removed region 352 (hereinafter referred to as "liquid film boundary 353") is kept as an organic solvent/hydrogen fluoride mixture vapor (IPA/HF vapor) atmosphere.

Figure 17D:
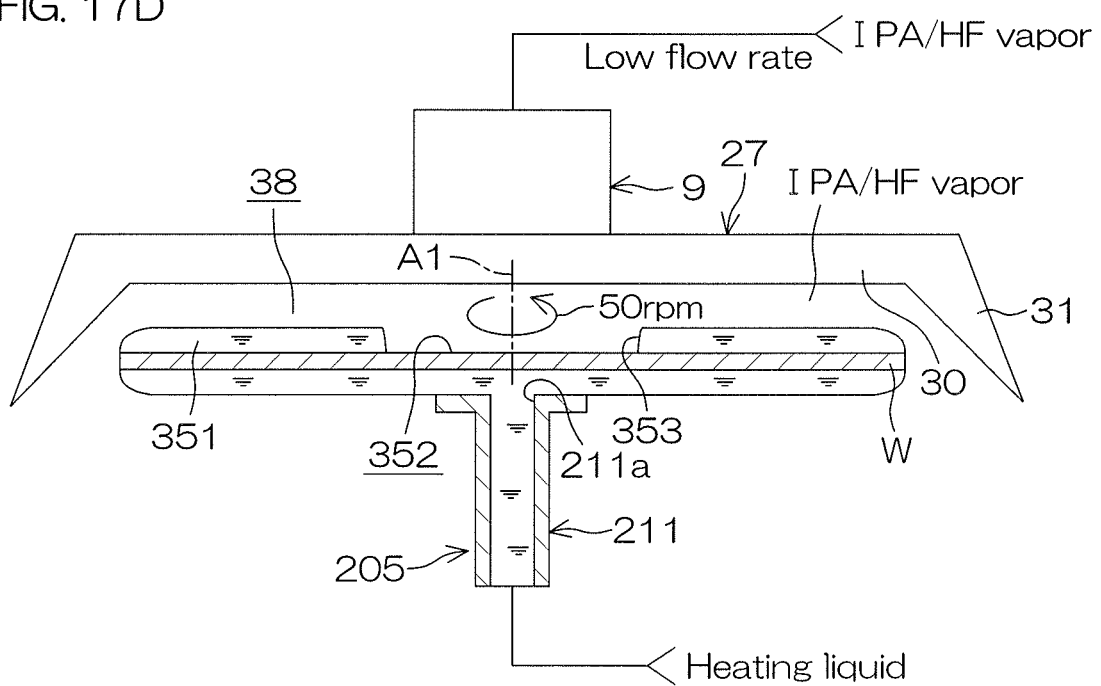
FIG. 17D is an illustrative cross-sectional view for describing the liquid film-removed region enlarging step (T24 of FIG. 16).
Figure 17E:
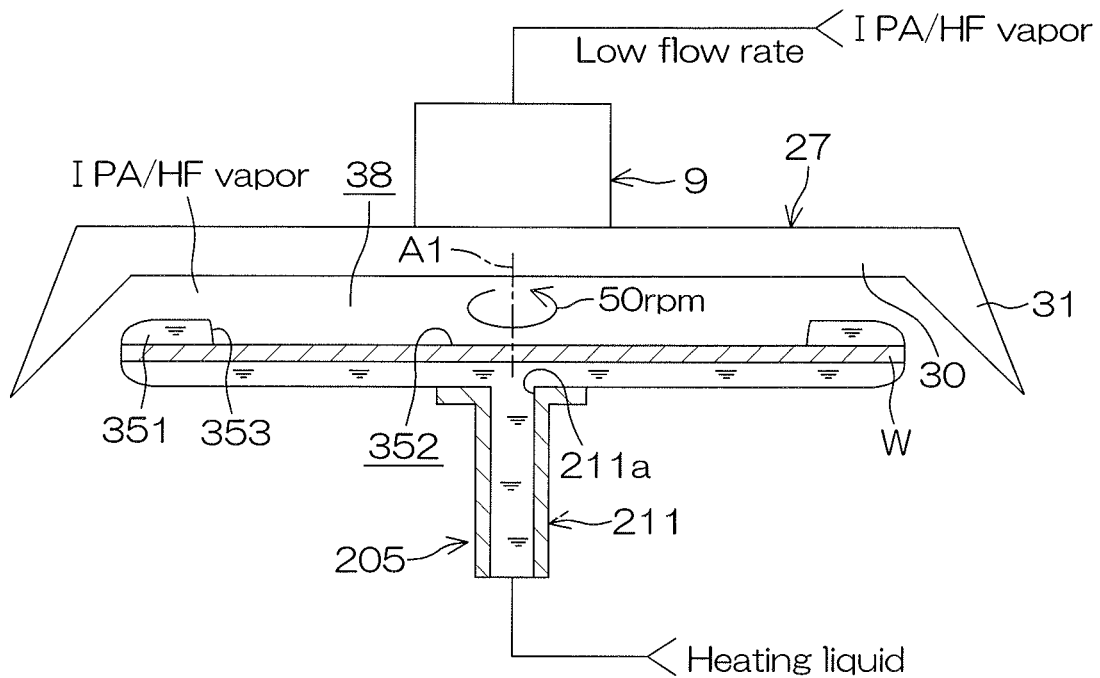
FIG. 17E is a diagram showing the state continuing to FIG. 17D, in the liquid film-removed region enlarging step.

After formation of the liquid film-removed region 352, the controller 3 controls the spin motor 13 to keep the rotational speed of the substrate W at the first rotational speed (for example, approximately 50 rpm). The liquid film-removed region 352 gradually enlarges as a result (liquid film-removed region enlarging step T24). As the liquid film-removed region 352 enlarges, as shown in FIG. 17D, the liquid film boundary 353 is moved toward the radially outer side. As shown in FIG. 17E, in the liquid film-removed region enlarging step T24, the liquid film-removed region 352 enlarges to the entire region of the upper surface of the substrate W. That is, the liquid film boundary 353 also is moved up to the peripheral edge of the upper surface of the substrate W. Enlargement of the liquid film-removed region 352 also occurs with the shielded space 38 in a state filled with organic solvent/hydrogen fluoride mixture vapor (IPA/HF vapor) (hydrogen fluoride atmosphere-holding step). That is, the liquid film boundary 353 is moved from the center portion of the substrate W to the peripheral edge of the upper surface of the substrate W, while maintaining the ambient atmosphere at the liquid film boundary 353 is kept as organic solvent/hydrogen fluoride mixture vapor (IPA/HF vapor).

In the liquid film-removed region enlarging step T24, as the liquid film boundary 353 moves, the rinse liquid is successively removed from between sections of the pattern P on the front surface of the substrate W (see FIG. 4), from the center portion of the substrate W toward the peripheral edge of the upper surface of the substrate W. A difference is produced in the surface tension acting on the pattern P through which the liquid film boundary 353 passes, whereby the pattern P instantaneously collapses toward the bulk portion side (that is, outward from the substrate W).

In the third substrate processing example, the liquid film boundary 353 is moved from the center portion of the upper surface of the substrate W to the peripheral edge of the upper surface of the substrate W, while keeping the ambient atmosphere at the liquid film boundary 353 as organic solvent/hydrogen fluoride mixture vapor (IPA/HF vapor). When the ambient atmosphere at the liquid film boundary 353 is kept as organic solvent/hydrogen fluoride mixture vapor (IPA/HF vapor), the hydrogen fluoride contained in the organic solvent/hydrogen fluoride mixture vapor (IPA/HF vapor) reacts with silicon oxides precipitated on the liquid film 351 of the rinse liquid, decomposing the silicon oxides to $H_2SiF_6$ and water.

Consequently, the hydrogen fluoride contained in the ambient atmosphere at the liquid film boundary 353 reacts with the silicon oxides precipitated on the liquid film 351 of the rinse liquid. As a result, the silicon oxides precipitated on the liquid film 351 of the rinse liquid either do not adhere to the tip portion Pa of the pattern P (see FIG. 4), or the silicon oxides that have adhered to the tip portion Pa of the pattern P (that is, the product 55 (see FIG. 9)) are likewise removed from the tip portion Pa of the pattern P.

Furthermore, in the liquid film-removed region enlarging step T24, the liquid film 351 of the rinse liquid is kept at approximately 70 to 80° C. Consequently, reaction of the hydrogen fluoride contained in the organic solvent/hydrogen fluoride mixture vapor (IPA/HF vapor) with silicon oxides forms $H_2SiF_6$ residue. However, the silicon oxides come in liquid contact with the rinse liquid which is present in the liquid film 351 of the rinse liquid and has a liquid temperature of approximately 70 to 80° C., thus promoting evaporation of such residue. Since the melting point of $H_2SiF_6$ is approximately 19° C., evaporation of the residue is accelerated in an environment of approximately 70 to 80° C. It is thereby possible to evaporate the residue and remove the residue from the front surface of the substrate W.

Moreover, in the third substrate processing example, the liquid film boundary 353 is moved toward the outer periphery of the substrate W, while keeping the surrounding area of the liquid film boundary 353 of the liquid film 351 of the rinse liquid as organic solvent vapor. Near the liquid film boundary 353 in the interior of the liquid film 351 of the rinse liquid, the difference in concentration of the organic solvent causes generation of Marangoni convection flowing in the direction away from the liquid film boundary 353. Consequently, regardless of the location of the liquid film boundary 353, Marangoni convection continues to be generated near the liquid film boundary 353 inside the liquid film 351 of the rinse liquid.

The particles removed by the chemical liquid step (S2 of FIG. 5), etc., are present in the liquid film 351 of the rinse liquid in some cases. Even when particles are present near the liquid film boundary 353 inside the liquid film 351 of the rinse liquid, the particles are subjected to Marangoni convection and move in the direction toward the bulk portion of the rinse liquid, i.e. the direction away from the liquid film boundary 353, the particles continuing to be incorporated into the liquid film 351 of the rinse liquid.

Consequently, with enlargement of the liquid film-removed region 352, the liquid film boundary 353 moves toward the outer periphery of the substrate W with the particles still incorporated in the bulk portion of the liquid film 351 of the rinse liquid. Furthermore, the particles are discharged from the upper surface of the substrate W together with the liquid film 351 of the rinse liquid, without emerging in the liquid film-removed region 352. Thus, particles do not remain on the upper surface of the substrate W after drying of the substrate W. It is therefore possible to reduce or prevent generation of particles during drying of the substrate W.

Figure 17F:
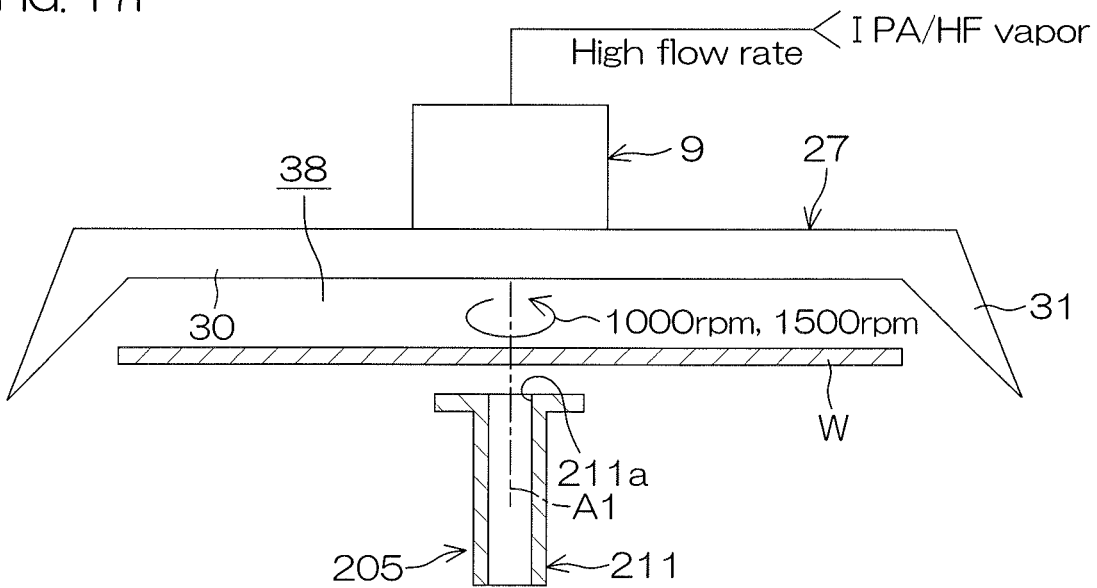
FIG. 17F is an illustrative cross-sectional view for describing the spin drying step (T25 of FIG. 16).

As shown in FIG. 17F, after the liquid film-removed region 352 has enlarged over the entire region of the upper surface of the substrate W, the controller 3 closes the heating fluid valve 213 to interrupt discharge of the heating fluid to the lower surface of the substrate W. In addition, the controller 3 adjusts the apertures of the flow adjusting valves 308, 311 to increase the discharge flow rate of the organic solvent/hydrogen fluoride mixture vapor (IPA/HF vapor) discharged from the center portion discharge port 33 to a high flow rate (for example, approximately 150 (liters/minute)). Also, the controller 3 further accelerates rotation of the substrate W to the spin-off drying speed (for example, approximately 1500 rpm). The liquid on the upper surface of the substrate W can thereby be spun off, and the entire upper surface of the substrate W can thereby be dried completely.

Upon completion of the drying step (S4 of FIG. 5), the controller 3 controls the facing member lifting unit 37 to raise the shielding plate 27 from the retreat position to the proximal position. The shielded space 38 thereby disappears. The controller 3 also closes the organic solvent vapor valve 307 and hydrogen fluoride vapor valve 310, interrupting discharge of the organic solvent/hydrogen fluoride mixture vapor (IPA/HF vapor) from the center portion discharge port 33. Next, the substrate W is carried out by the transfer robot CR.

Thus, according to the third preferred embodiment, actions and effects are exhibited that are equivalent to the actions and effects explained in relation to the first preferred embodiment.

<Recovery Test>

A recovery test for recovering a collapsed pattern will now be described. A semiconductor substrate having a pattern with aspect ratio AR16 formed thereon was used as the sample for the first recovery test. Two samples (sample 1 and sample 2) were subjected to a spin drying step (corresponding to S5 of FIG. 5), and the pattern of each sample was caused to collapse. The collapse rates of the patterns of each sample were approximately the same.

Sample 1: Sample 1 was then placed in a shielded space (a space with the atmosphere essentially shielded from the surrounding area), and sample 1 was heated from the rear surface side to approximately 120° C. while dropping IPA solution at approximately 75° C. onto the front surface of sample 1, and in that state it was exposed to the atmosphere in the shielded space for 0.5 minute. The drip volume of the IPA solution was approximately 1 (milliliter).

Sample 2: Sample 2 was then placed in a shielded space, and sample 2 was heated from the rear surface side to approximately 120° C. while dropping an IPA/hydrofluoric acid liquid mixture at approximately 75° C. onto the front surface of sample 2, and in that state it was exposed to the atmosphere in the shielded space for 0.5 minute. The drip volume of the IPA/hydrofluoric acid liquid mixture was approximately 1 (milliliter). The mixing ratio of the IPA solution and hydrofluoric acid in the IPA/hydrofluoric acid liquid mixture (concentrated hydrofluoric acid at 50% concentration) was 100:1, as the volume ratio.

Next, sample 1 and sample 2 were removed from the shielded space, and the number of collapsed patterns were determined by analyzing SEM images. The collapse rate for sample 1 was high at 10.6%, while the collapse rate for sample 2 was low at 2.5%.

Figure 18A:
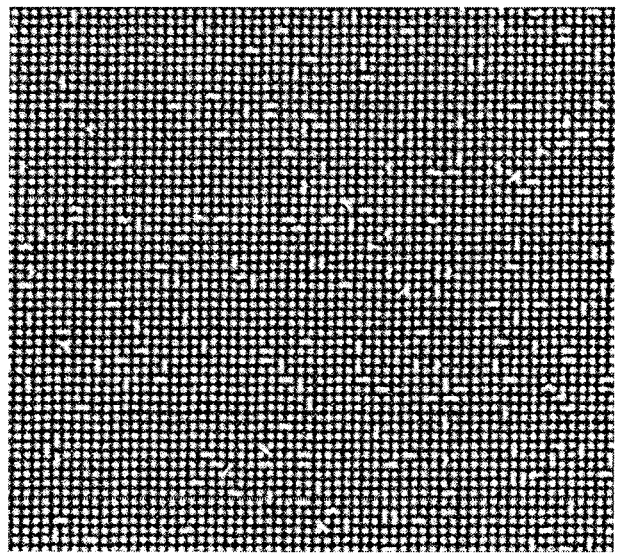
FIGS. 18A and 18B are images showing the results of a recovery test.
Figure 18B:
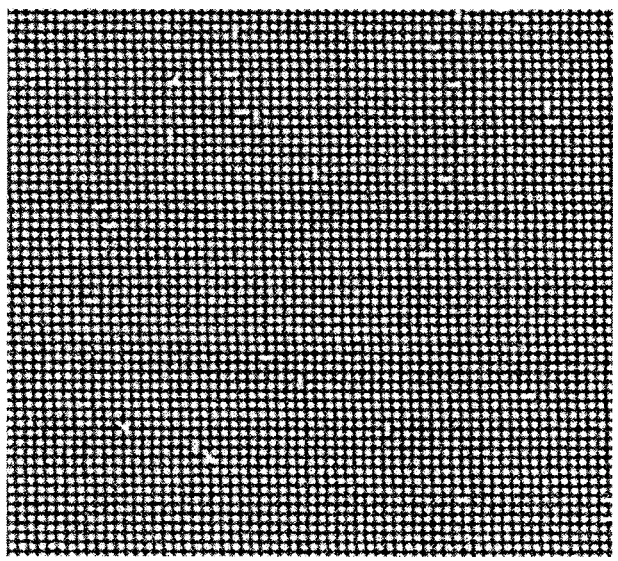

FIGS. 18A and 18B show SEM images of sample 1 and sample 2, respectively.

Three preferred embodiments of the present invention were explained above, but the present invention may also be implemented in yet other embodiments.

Figure 19:
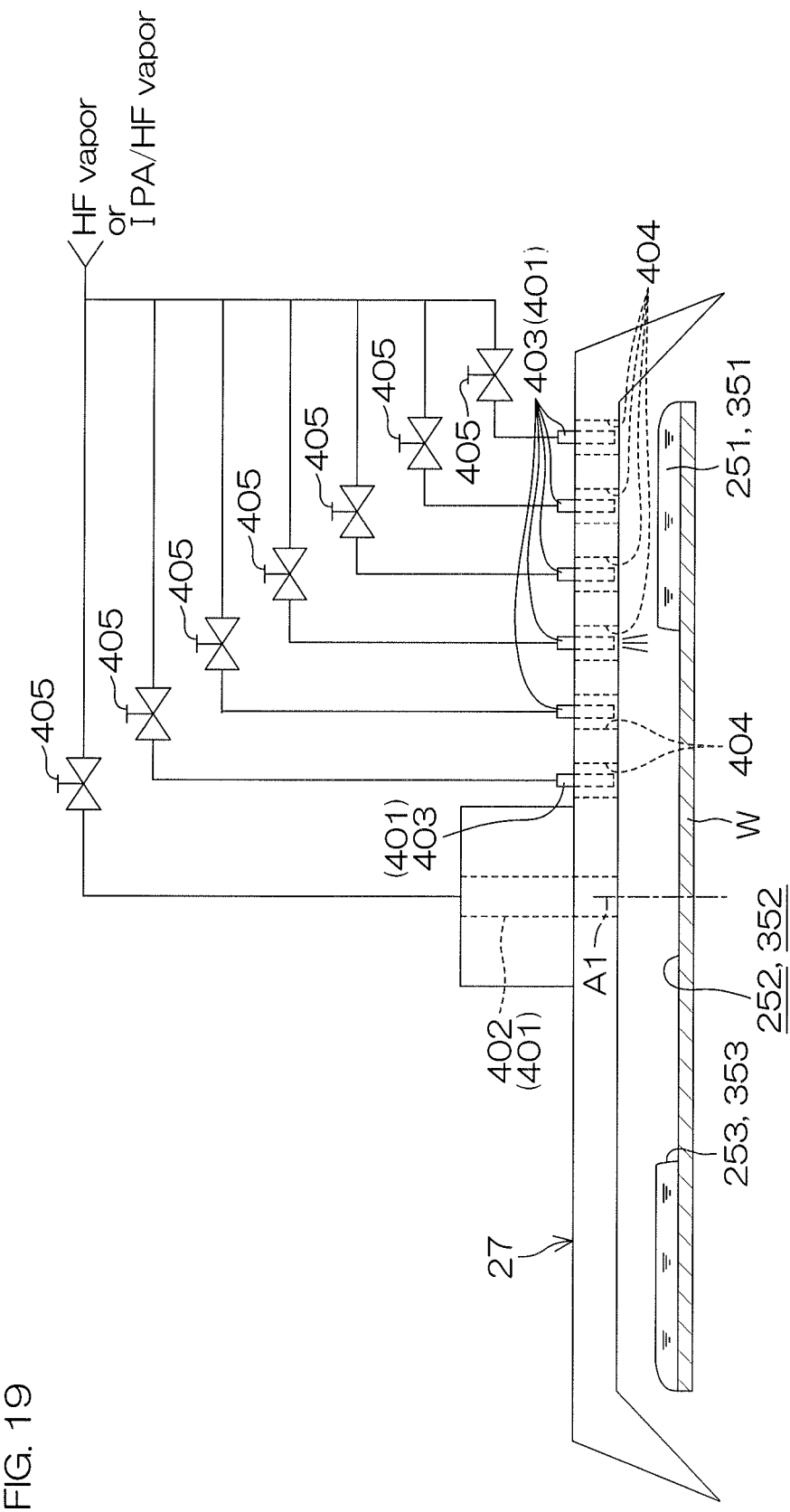
FIG. 19 is a diagram showing a modification example of the present invention.
Figure 20:
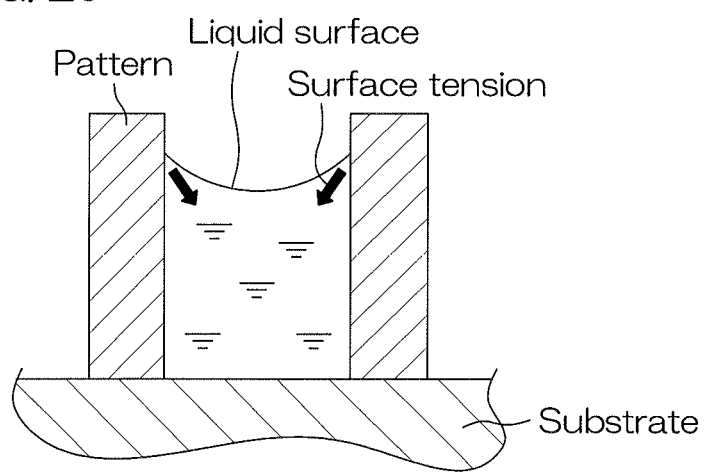
FIG. 20 is an illustrative cross-sectional view for describing principles of pattern collapse due to surface tension.

For example, as shown in FIG. 19, in the second and third preferred embodiments, a plurality of upper surface nozzles 401 may be provided running through the shielding plate 27, and the upper surface nozzle 401 discharging the hydrogen fluoride vapor (HF vapor) or organic solvent/hydrogen fluoride mixture vapor (IPA/HF vapor) may be changed to match enlargement of the liquid film-removed regions 252, 352. The upper surface nozzle 401 includes a central nozzle 402 positioned on the rotational axis A1 of the substrate W, and a plurality of surrounding nozzles 403 disposed at locations away from the rotational axis A1. The plurality of surrounding nozzles 403 are inserted in insertion holes 404 running vertically through the shielding plate 27, with discharge ports which are formed at their lower ends, facing the interior of the shielded space 38. The design is such that the hydrogen fluoride vapor (HF vapor) or organic solvent/hydrogen fluoride mixture vapor (IPA/HF vapor) is supplied to the plurality of surrounding nozzles 403 and each surrounding nozzle, through respective valves 405.

In the liquid film-removed region enlarging step (T14 of FIG. 12 or T24 of FIG. 16), with enlargement of the liquid film-removed regions 252, 352, the liquid film boundaries 253, 353 move from the center portion of the substrate W toward the peripheral edge. During this time, only the upper surface nozzle 401 that is suited for supply to the moving liquid film boundaries 253, 353 (that is, the upper surface nozzle 401 closest to the liquid film boundaries 253, 353) may discharge the hydrogen fluoride vapor (HF vapor) or organic solvent/hydrogen fluoride mixture vapor (IPA/HF vapor). In other words, as the liquid film-removed regions 252, 352 enlarge, the upper surface nozzle 401 discharging the hydrogen fluoride vapor (HF vapor) or organic solvent/ hydrogen fluoride mixture vapor (IPA/HF vapor) may be switched.

Also, the first to third substrate processing examples were explained as being carried out in the chamber 4, but the first to third substrate processing examples may instead be carried out inside a sealed chamber whose interior space has been sealed from the surrounding area. The interior space of a sealed chamber corresponds to the shielded space according to the present invention.

Also, the shielding plate 27 may be rotated around the rotational axis A2, in parallel with the liquid film-removed region enlarging step according to the first to third substrate processing examples (T4 of FIG. 6, T14 of FIG. 12, and T24 of FIG. 16).

In addition, in the spin drying step T15 according to the second substrate processing example (see FIG. 12) and the spin drying step T25 according to the third substrate processing example (see FIG. 16), discharge of the hydrogen fluoride vapor (HF vapor) or organic solvent/hydrogen fluoride mixture vapor (IPA/HF vapor) from the center portion discharge port 33 may be interrupted at the moment when the predetermined period of time from start of the spin drying step T15, T25 has elapsed, and then inert gas may be supplied to the shielded space 38 from the peripheral discharge port 35.

Moreover, the first preferred embodiment was explained assuming that an organic solvent/hydrofluoric acid mixture at ordinary temperature is supplied to the upper surface of the substrate W, but an organic solvent/hydrofluoric acid mixture at approximately 70 to 80° C. may instead be supplied to the upper surface of the substrate W.

Furthermore, the first preferred embodiment was explained assuming that discharge of the organic solvent/ hydrofluoric acid mixture from the center portion discharge port 33 is how supply of the organic solvent/hydrofluoric acid mixture to the upper surface of the substrate W is carried out, but instead, the organic solvent liquid and hydrofluoric acid may be separately discharged from a plurality of discharge ports provided on the substrate-facing surface 43, and the organic solvent liquid and hydrofluoric acid may be mixed at the upper surface of the substrate W.

Furthermore, in the first preferred embodiment, the example given for the liquid film of the processing liquid formed on the upper surface of the substrate W was an organic solvent/hydrofluoric acid mixture, but it is sufficient if the liquid film of a processing liquid is a liquid film of a hydrofluoric acid-containing solution, and examples other than the organic solvent/hydrofluoric acid mixture include liquid films of mixtures of hydrofluoric acid and other liquids (for example, functional water (ozone water, hydrogen water, carbonated water)), and liquid films of hydrofluoric acid.

Moreover, the second preferred embodiment was explained assuming that an organic solvent liquid at ordinary temperature is supplied to the upper surface of the substrate W, but an organic solvent liquid at approximately 70 to 80° C. may instead be supplied to the upper surface of the substrate W.

Furthermore, in the first and second preferred embodiments, the rinse liquid supply unit 305 according to the third preferred embodiment may be used instead of the rinse liquid supply unit 7, arranged to supply the rinse liquid to the upper surface of the substrate. That is, the design may be such that the rinse liquid is discharged from the center portion discharge port 33.

Also, in the first to third preferred embodiments, the example of an organic solvent was IPA, but other examples of organic solvents include methanol, ethanol, HFE (hydrofluoroether), and acetone, etc. In addition, instead of consisting of only a single component, the organic solvent may be a fluid mixtures with other components. For example, it may be a liquid mixture of IPA and acetone, or a fluid mixture of IPA and methanol.

Also, the lower surface supply unit 205 may be adopted as the heating unit in the substrate processing apparatus 1 according to the first preferred embodiment. Conversely, the hot plate 8 may be used as the heating unit in the substrate processing apparatuses 201, 301 according to the second or third preferred embodiment.

The heating unit may alternatively be omitted. In this case, in the liquid film-removed region enlarging step according to the first to third substrate processing examples (T4 of FIG. 6, T14 of FIG. 12, and T24 of FIG. 16), the processing liquid included in the liquid film of the processing liquid may be at ordinary temperature.

Furthermore, each of the preferred embodiments described above were explained with the assumption that the substrate processing apparatuses 1, 201, 301 are apparatuses for processing of disk-shaped substrates W, but the substrate processing apparatuses 1, 201, 301 may instead be apparatuses that process polygonal substrates, such as glass substrates for liquid crystal display devices.

Although the preferred embodiments of the present invention is described in detail above, the preferred embodiment is merely specific examples used to clarify the technical content of the present invention. The present invention should not be interpreted as being limited only to these specific examples, and the scope of the present invention is limited only by the appended claims.

The present application corresponds to Japanese Patent Application Publication No. 2016-177883 filed on Sep. 12, 2016 in the Japan Patent Office, and the entire disclosure of this application is incorporated herein by reference.

What is claimed is:

1. A substrate processing method comprising:
    a substrate holding step of horizontally holding a substrate having an upper surface on which a first pattern and a second pattern adjacent to each other are formed;
    a liquid film forming step of supplying a processing liquid onto the upper surface of the substrate to form a liquid film of the processing liquid covering the upper surface of the substrate;
    a liquid film-removed region-forming step of partially eliminating the processing liquid from the liquid film of the processing liquid to form a liquid film-removed region in the liquid film of the processing liquid;
    a liquid film-removed region enlarging step of enlarging the liquid film-removed region toward an outer periphery of the substrate;
    a hydrogen fluoride atmosphere-holding step of keeping an ambient atmosphere at a boundary between the liquid film-removed region and the liquid film of the processing liquid as an atmosphere of a hydrogen fluoride-containing vapor containing hydrogen fluoride, in parallel with the liquid film-removed region enlarging step, wherein the hydrogen fluoride atmosphere-holding step includes a hydrogen fluoride-containing vapor supply step of supplying the hydrogen fluoride-containing vapor to a surrounding area of the liquid film of the processing liquid;
    a step of removing silicon oxides that adhere a tip portion of the first pattern and a tip portion of the second pattern to each other, in parallel with the liquid film-removed region enlarging step; and
    a step of removing a residue, which is formed by a reaction of the hydrogen fluoride with the silicon oxides, from the upper surface of the substrate, in parallel with the liquid film-removed region enlarging step.

2. The substrate processing method according to claim 1, wherein in the liquid film-removed region enlarging step, the processing liquid included in the liquid film of the processing liquid has a liquid temperature that is higher than room temperature.

3. The substrate processing method according to claim 2, wherein the liquid film of the processing liquid formed in the liquid film forming step includes a processing liquid that is at room temperature; and
    the method further comprising, in parallel with the liquid film-removed region enlarging step, a heating step of heating the liquid film of the processing liquid.

4. The substrate processing method according to claim 1, wherein the liquid film of the processing liquid formed by the liquid film forming step includes a liquid film of a hydrofluoric acid-containing solution containing hydrofluoric acid;
    the method further comprises a step of disposing, after the liquid film forming step, a facing member opposing an entire region of the upper surface of the substrate at a shielding position proximal to the upper surface of the substrate so as to form a shielded space between the facing member and the upper surface of the substrate; and
    the hydrogen fluoride-containing vapor supply step includes a step of evaporating the hydrofluoric acid included in the liquid film of the hydrofluoric acid-containing solution within the shielded space, to supply the hydrogen fluoride-containing vapor to the shielded space.

5. The substrate processing method according to claim 4, wherein the liquid film of the hydrofluoric acid-containing solution includes a liquid film of a liquid mixture of an organic solvent having a lower surface tension than water, and hydrofluoric acid.

6. The substrate processing method according to claim 1, wherein
    the method further comprises a step of disposing, after the liquid film forming step, a facing member opposing an entire region of the upper surface of the substrate at a shielding position proximal to the upper surface of the substrate so as to form a shielded space between the facing member and the upper surface of the substrate; and the hydrogen fluoride-containting vapor supply step supplies the hydrogen fluoride-containing vapor to the shielded space, in order to keep the surrounding area of the liquid film of the processing liquid as hydrogen fluoride vapor.

7. The substrate processing method according to claim 6, wherein the liquid film of the processing liquid includes a liquid film of an organic solvent having a lower surface tension than water.

8. The substrate processing method according to claim 6, wherein the hydrogen fluoride-containing vapor includes vapor including an organic solvent having a lower surface tension than water, and hydrogen fluoride.

9. The substrate processing method according to claim 8, wherein the liquid film of the processing liquid includes a liquid film of water.

10. The substrate processing method according to claim 6, wherein the hydrogen fluoride vapor supply step includes a step of blowing the hydrogen fluoride-containing vapor toward the upper surface of the substrate.

11. A substrate processing method comprising:

a substrate holding step of horizontally holding a substrate having an upper surface on which a first pattern and a second pattern adjacent to each other are formed;

a liquid film forming step of supplying water not containing an organic solvent having a surface tension lower than a surface tension of water onto the upper surface of the substrate to form a liquid film of the water covering the upper surface of the substrate, the liquid film being of the supplied water not containing the organic solvent;

a liquid film-removed region-forming step of partially eliminating the water from the liquid film of the water to form a liquid film-removed region in the liquid film of the water;

a liquid film-removed region enlarging step of enlarging the liquid film-removed region toward an outer periphery of the substrate;

an atmosphere-holding step of keeping an ambient atmosphere at a boundary between the liquid film-removed region and the liquid film of the water as an atmosphere of an organic solvent vapor containing the organic solvent and a hydrogen fluoride-containing vapor containing hydrogen fluoride, in parallel with the liquid film-removed region enlarging step;

a step of removing silicon oxides that adhere a tip portion of the first pattern and a tip portion of the second pattern to each other, in parallel with the liquid film-removed region enlarging step; and a step of removing a residue, which is formed by a reaction of the hydrogen fluoride with the silicon oxides, from the upper surface of the substrate, in parallel with the liquid film-removed region enlarging step, wherein the atmosphere-holding step includes a step of discharging the organic solvent vapor and the hydrogen fluoride-containing vapor toward the upper surface of the substrate.

12. The substrate processing method according to claim 11, further comprising a spin drying step of rotating the substrate at a spin-off drying speed after the liquid film-removed region enlarging step, wherein the organic solvent vapor and the hydrogen fluoride-containing vapor are discharged toward the upper surface of the substrate, in parallel with the spin drying step, at a flow rate that is greater than a flow rate of the organic solvent vapor and the hydrogen fluoride-containing vapor in the atmosphere-holding step.

* * * * *